(12) United States Patent
Wang et al.

(10) Patent No.: US 11,418,209 B2
(45) Date of Patent: Aug. 16, 2022

(54) SIGNAL CONVERSION CIRCUIT UTILIZING SWITCHED CAPACITORS

(71) Applicant: M31 TECHNOLOGY CORPORATION, Hsinchu County (TW)

(72) Inventors: Hui Huan Wang, Hsinchu (TW); Meng Hsuan Wu, Hsinchu (TW)

(73) Assignee: M31 TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 17/223,933

(22) Filed: Apr. 6, 2021

(65) Prior Publication Data
US 2021/0313998 A1 Oct. 7, 2021

Related U.S. Application Data

(60) Provisional application No. 63/005,943, filed on Apr. 6, 2020.

(51) Int. Cl.
*H03M 1/12* (2006.01)
*H03M 1/46* (2006.01)
(Continued)

(52) U.S. Cl.
CPC ............ *H03M 1/466* (2013.01); *G05F 1/461* (2013.01); *G05F 1/468* (2013.01); *H03L 7/0807* (2013.01);
(Continued)

(58) Field of Classification Search
CPC .... H03M 1/468; H03M 1/0695; H03M 1/462; H03M 1/144; H03M 1/466; H03M 1/38; H03M 1/0604; H03M 1/46; H03M 1/68; H03M 1/804; H03M 1/00; H03M 1/001; H03M 1/06; H03M 1/0602; H03M 1/10; H03M 1/12; H03M 1/1245; H03M 1/403; H03M 1/1033
(Continued)

(56) References Cited

U.S. PATENT DOCUMENTS 6,707,403 B1 * 3/2004 Hurrell ............... H03M 1/1061
341/172
7,812,659 B1 10/2010 Shumarayev et al.
(Continued)

*Primary Examiner* — Linh V Nguyen
(74) *Attorney, Agent, or Firm* — WPAT, P.C., Intellectual Property Attorneys; Anthony King

(57) ABSTRACT

A signal conversion circuit includes a first pair of capacitors and a comparator. The first pair of capacitors includes a first capacitor and a second capacitor having a same capacitance value. Each of the first capacitor and the second capacitor is coupled to an input signal during a first sampling phase, while uncoupled from the input signal during a first conversion phase after the first sampling phase. The comparator has a first input terminal and a second input terminal. During the first conversion phase, the first capacitor is coupled between the first input terminal and a first reference signal, the second capacitor is coupled between the first input terminal and a second reference signal different from the first
(Continued)

reference signal, and the comparator is configured to compare a signal level at the first input terminal and a signal level at the second input terminal to convert the input signal.

16 Claims, 16 Drawing Sheets

(51) Int. Cl.
  *G05F 1/46* (2006.01)
  *H04B 1/40* (2015.01)
  *H03L 7/08* (2006.01)
  *H03L 7/089* (2006.01)
  *H04L 7/033* (2006.01)
(52) U.S. Cl.
  CPC ........ *H03L 7/0891* (2013.01); *H03M 1/1245* (2013.01); *H03M 1/462* (2013.01); *H04B 1/40* (2013.01); *H04L 7/0331* (2013.01)
(58) Field of Classification Search
  USPC ................ 341/118–120, 155, 161, 172, 150
  See application file for complete search history.

(56) References Cited

U.S. PATENT DOCUMENTS

| | | | |
|---|---|---|---|
| 8,497,795 B2* | 7/2013 | Le Tual | H03M 1/468 341/163 |
| 8,508,400 B2 | 8/2013 | Wu et al. | |
| 8,599,059 B1* | 12/2013 | Chung | H03M 1/466 341/172 |
| 8,786,484 B2* | 7/2014 | Cheong | H03M 1/12 341/172 |
| 9,018,576 B2 | 4/2015 | Gong et al. | |
| 9,385,740 B2* | 7/2016 | Wang | H03M 1/38 |
| 9,461,665 B1* | 10/2016 | Kim | H03M 1/462 |
| 9,680,492 B1* | 6/2017 | Farley | H03M 1/0863 |
| 11,050,431 B1* | 6/2021 | Ma | H03M 1/0697 |
| 2012/0112948 A1* | 5/2012 | Le Tual | H03M 1/468 341/172 |
| 2012/0274489 A1* | 11/2012 | Chang | H03M 1/462 341/110 |
| 2018/0019760 A1* | 1/2018 | Tang | H03M 1/1245 |

* cited by examiner

SIGNAL CONVERSION CIRCUIT UTILIZING SWITCHED CAPACITORS

PRIORITY CLAIM AND CROSS-REFERENCE

The present application claims priority to U.S. Provisional Patent Application No. 63/005,943, filed on Apr. 6, 2020, which is incorporated by reference herein in its entirety.

BACKGROUND

The present disclosure relates to signal conversion and, more particularly, to a signal conversion circuit utilizing switched capacitors.

Successive-approximation register (SAR) analog-to-digital converters (ADCs) are popular for system-on-chip (SoC) designs because of low power consumption, simple structure and small form factor. The basic principle of operation of SAR ADCs is to use a series of comparisons to implement a binary search algorithm, thereby determining each bit of a digital output converted from an analog input. For example, before a conversion result of a SAR ADC converges on the digital output, a signal level of the analog input may be compared with different quantization levels, which are produced in response to different digital codes. The number of bit cycles needed for converting the analog input can be determined according to the resolution of the SAR ADC.

SUMMARY

The described embodiments provide a signal conversion circuit, which may include a switched-capacitor structure used as a switched-capacitor digital-to-analog converter (DAC). The signal conversion circuit can use bottom-plate sampling or top-plate sampling to perform signal conversion. In addition, the signal conversion circuit can be used to implement at least a portion of an ADC, such as a SAR ADC, a pipeline ADC or a Delta-Sigma ADC.

Some embodiments described herein may include a signal conversion circuit. The signal conversion circuit includes a first pair of capacitors and a comparator. The first pair of capacitors includes a first capacitor and a second capacitor having a same capacitance value. Each of the first capacitor and the second capacitor is coupled to an input signal during a first sampling phase, while uncoupled from the input signal during a first conversion phase after the first sampling phase. The comparator has a first input terminal and a second input terminal. During the first conversion phase, the first capacitor is coupled between the first input terminal and a first reference signal, the second capacitor is coupled between the first input terminal and a second reference signal different from the first reference signal, and the comparator is configured to compare a signal level at the first input terminal and a signal level at the second input terminal to convert the input signal.

Some embodiments described herein may include a signal conversion circuit. The signal conversion circuit includes a first pair of capacitors and a comparator. The first pair of capacitors includes a first capacitor and a second capacitor having a same capacitance value. During a first sampling phase, the first capacitor is coupled between an input signal and a first reference signal, and the second capacitor is coupled between the input signal and a second reference signal different from the first reference signal. The comparator has a first input terminal and a second input terminal. During a first conversion phase after the first sampling phase, each of the first capacitor and the second capacitor is coupled to the first input terminal while uncoupled from the input signal, and the comparator is configured to compare a signal level at the first input terminal and a signal level at the second input terminal to convert the input signal.

With the use of the proposed signal conversion scheme, power consumption caused by a power-hungry register for storing a common-mode voltage can be greatly reduced. Additionally, the proposed signal conversion scheme can reduce the effect of capacitor mismatch by exchanging reference signals applied to two capacitors included in a same pair of capacitors in response to different conversion cycles.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
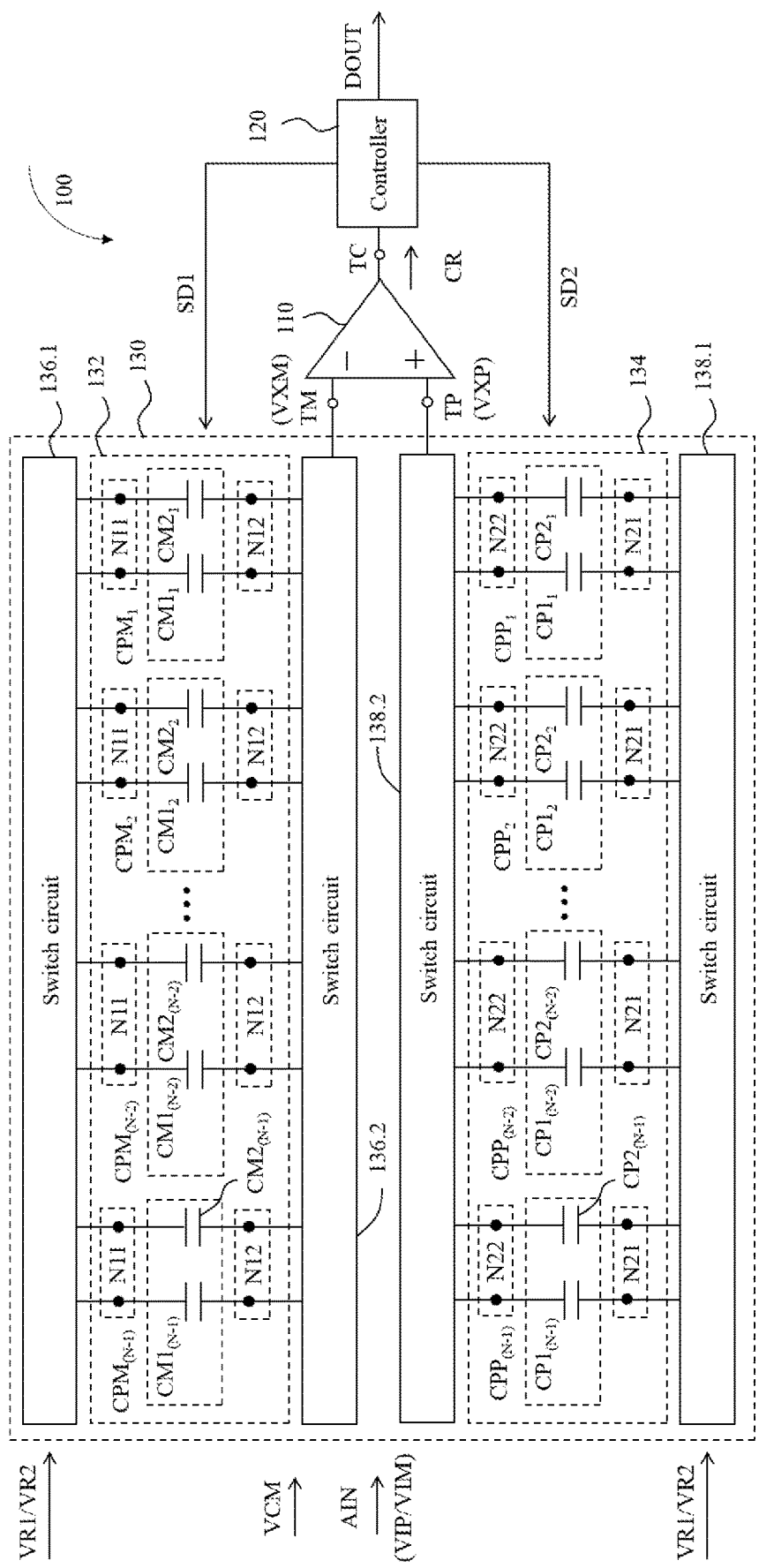
FIG. 1 is a block diagram illustrating an exemplary signal conversion circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, parameter values in the description that follows may vary depending on a given technology node. As another example, parameter values for a given technology node may vary depending on a given application or operating scenario, In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

An N-bit SAR ADC may take a conversion cycle, including a sampling phase and a conversion phase, to convert an analog input to generate an N-bit digital output. The analog input is acquired during the sampling phase, and N bits of the digital output can be determined in N bit cycles of the conversion phase, respectively. To further reduce power-consumption, a digital-to-analog converter (DAC) included in the N-bit SAR ADC may be implemented using a capacitive DAC (CDAC). For example, the N-bit SAR ADC may be an N-bit ADC with differential inputs. The CDAC can be configured to convert the differential inputs with the aid of a common-mode voltage of the differential inputs during the conversion phase. The common-mode voltage should settle at the end of each bit cycle of the conversion phase. However, a period of time reserved for settling the common-mode voltage will be insufficient when the resolution of the N-bit SAR ADC increases. A power-hungry buffer for storing the common-mode voltage is needed.

The present disclosure describes exemplary signal conversion circuits, each of which includes a pair of capacitors with a same capacitance value or weighted value to perform signal conversion. The pair of capacitors can be electrically connected to a first reference signal and a second reference signal different from the first reference signal. When used as at least a portion of a SAR ADC, an exemplary signal conversion circuit can utilize the pair of capacitors, rather than a capacitor electrically connected to a common-mode voltage, during at least one of a sampling phase and a conversion phase in a conversion cycle to implement a binary search algorithm. In other words, the pair of capacitors can replace the capacitor which is electrically connected to the common-mode voltage. A power-hungry buffer for storing the common-mode voltage would be unnecessary.

In some embodiments, the first reference signal and the second reference signal are different from the common-mode voltage. For example, the first reference signal and the second reference signal may be two supply voltages supplied to the SAR ADC. In some embodiments, the pair of capacitors can be regarded as being provided by splitting the capacitor which is electrically connected to the common-mode voltage. For example, the capacitance value of each capacitor in the pair of capacitors may be equal to one half of the capacitance value of the capacitor which is electrically connected to the common-mode voltage. In some embodiments, the pair of capacitors can be switched for signal conversion in a bottom-plate sampling scheme or a top-plate sampling scheme. In some embodiments, reference signals respectively coupled to a first capacitor and a second capacitor, included in the pair of capacitors, can be exchanged when the exemplary signal conversion circuit operates in different conversion cycles, thereby reducing the effect of capacitor mismatch.

The proposed signal conversion scheme can be applied to a switched-capacitor circuit where a third reference signal different from each of the first reference signal and the second reference signal was originally needed. In addition, the proposed signal conversion scheme can operate in a differential mode or a single-ended mode to perform signal conversion. Further description is provided below.

FIG. 1 is a block diagram illustrating an exemplary signal conversion circuit in accordance with some embodiments of the present disclosure. The signal conversion circuit 100 is configured to convert an input signal AIN to an output signal DOUT. In the present embodiment, the signal conversion circuit 100 can be implemented as an N-bit SAR ADC, wherein N is a positive integer, the input signal AIN can be an analog voltage, and the output signal DOUT can be an N-bit digital word. The signal conversion circuit 100 can be configured to sample the input signal AIN during a sampling phase in a conversion cycle, and convert the input signal AIN to the output signal DOUT during a conversion phase after the sampling phase in the conversion cycle.

The input signal AIN can be a differential signal or a single-ended signal. The signal conversion circuit 100 can operate in a differential mode or a single-ended mode to convert the input signal AIN. In the present embodiment, the input signal AIN can be implemented as a differential signal which includes a plurality of voltage signals VIP and VIM. One of the voltage signals VIP and VIM may be a positive component of the differential signal, and the other may be a negative component of the differential signal. The signal conversion circuit 100 can operate in a differential mode to perform signal conversion. However, this is not intended to limit the scope of the present disclosure. In some embodiments where the input signal AIN is implemented as a single-ended signal, the signal conversion circuit 100 can operate in a single-ended mode to perform signal conversion without departing from the scope of the present disclosure.

The signal conversion circuit 100 includes, but is not limited to, a comparator 110, a controller 120 and a DAC 130. The comparator 110, having an input terminal TM, an input terminal TP and an output terminal TC, is configured to compare a signal level at the input terminal TM and a signal level at the input terminal TP to output a comparison result CR from the output terminal TC. The controller 120, coupled to the comparator 110, is configured to generate the output signal DOUT according to the comparison result CR. The controller 120 is further configured to generate a plurality of digital signals SD1 and SD2 according to the comparison result CR. Each of the digital signals SD1 and SD2 can be a multi-bit digital signal.

The DAC 130, coupled to the comparator 110 and the controller 120, is configured to convert the digital signals SD1 and SD2 and accordingly produce an analog output, which includes a voltage signal VXM at the input terminal TM and a voltage signal VXP at the input terminal TP. In the present embodiment, the DAC 130 can serve as an (N−1)-bit DAC implemented using a switched-capacitor structure. The DAC 130 may include a plurality of switched capacitor arrays 132 and 134, and a plurality of switch circuits 136.1, 136.2, 138.1 and 138.2.

The switched capacitor array 132 includes (N−1 pairs of capacitors $CPM_1$-$CPM_{(N-1)}$, wherein each pair of capacitors includes a plurality of capacitors, i.e. one of capacitors $CM1_1$-$CM1_{(N-1)}$ and one of capacitors $CM2_1$-$CM2_{(N-1)}$. Each capacitor includes a terminal N11 and a terminal N12.

The capacitors in the same pair of capacitors can have the same or substantially the same capacitance value. In addition, the (N−1) pairs of capacitors $CPM_1$-$CPM_{(N-1)}$ may have binary weighted capacitance values. For example, respective signal levels at the terminals N11 of the pairs of capacitors $CPM_{(N-1)}$ may correspond to a bit value of the most significant bit (MSB) of the output signal DOUT, and respective signal levels at the terminals N11 of the pairs of capacitors $CPM_1$ may correspond to a bit value of the least significant bit (LSB) of the output signal DOUT. Each of the capacitors $CM1_i$ and $CM2_i$ can have a capacitance value equal to one half of that of each of the capacitors $CM1_{(i+1)}$ and $CM2_{(i+1)}$, wherein i is an integer ranging from 1 to (N−2).

Similarly, the switched capacitor array 134 includes (N−1) pairs of capacitors $CPP_1$-$CPP_{(N-1)}$, wherein each pair of capacitors includes a plurality of capacitors, i.e. one of capacitors $CP1_1$-$CP1_{(N-1)}$ and one of capacitors $CP2_1$-$CP2_{(N-1)}$. Each capacitor includes a terminal N21 and a terminal N22. The capacitors in the same pair of capacitors can have the same or substantially the same capacitance value. In addition, the (N−1) pairs of capacitors $CPP_1$-$CPP_{(N-1)}$ may have binary weighted capacitance values.

The switch circuit 136.1 is configured to allow the terminal N11 of each capacitor in the (N−1) pairs of capacitors $CPM_1$-$CPM_{(N-1)}$ to be switchably coupled to a plurality of reference signals VR1 and VR2 according to the digital signal SD1. The switch circuit 136.2 is configured to allow the terminal N12 of each capacitor in the (N−1) pairs of capacitors $CPM_1$-$CPM_{(N-1)}$ to be selectively coupled to the input terminal TM according to the digital signal SD1. Similarly, the switch circuit 138.1 is configured to allow the terminal N21 of each capacitor in the (N−1) pairs of capacitors $CPP_1$-$CPP_{(N-1)}$ to be switchably coupled to the reference signals VR1 and VR2 according to the digital signal SD2. The switch circuit 138.2 is configured to allow the terminal N22 of each capacitor in the (N−1) pairs of capacitors $CPP_1$-$CPP_{(N-1)}$ to be selectively coupled to the input terminal TP according to the digital signal SD2.

Each of the reference signals VR1 and VR2 is different from a common-mode voltage VCM of the voltage signals VIP and VIM. By way of example but not limitation, each of the reference signals VR1 and VR2 may a supply voltage supplied to the signal conversion circuit 100, wherein the reference signal VR1 may be a power supply voltage, and the reference VR2 may be a ground voltage. As another example, a signal level of the common-mode voltage VCM is equal to an average of a signal level of the reference signal VR1 and a signal level of the reference signal VR2.

In operation, each capacitor of the DAC 130 may be coupled to the input signal AIN during the sampling phase, while uncoupled from the input signal MN during the conversion phase. For example, each capacitor of the switched capacitor array 132 may be coupled to the voltage signal VIP during the sampling phase, while uncoupled from the voltage signal VIP during the conversion phase. Each capacitor of the switched capacitor array 134 may be coupled to the voltage signal VIM during the sampling phase, while uncoupled from the voltage signal VIM during the conversion phase.

In addition, during the conversion phase, the capacitor $CM1_k$ in the pair of capacitors $CPM_k$ (k is an integer ranging from 1 to (N−1)) can be coupled between the input terminal TM and the reference signal VR1, and the capacitor $CM2_k$ in the pair of capacitors $CPM_k$ can be coupled between the input terminal TM and the reference signal VR2. Similarly, during the conversion phase, the capacitor $CP1_k$ in the pair of capacitors $CPP_k$ can be coupled between the input terminal TP and the reference signal VR1, and the capacitor $CP2_k$ in the pair of capacitors $CP1_k$ can be coupled between the input terminal TP and the reference signal VR2. The comparator 110 can be configured to, during the conversion phase, compare a signal level at the input terminal TM and a signal level at the input terminal TP to convert the input signal AIN.

When the comparison result CR indicates that the signal level at the input terminal TM is less than the signal level at the input terminal TP, the capacitor $CM2_k$ can be arranged to be coupled between the input terminal TM and the reference signal VR1. When the comparison result CR indicates that the signal level at the input terminal TM is greater than the signal level at the input terminal TP, the capacitor $CM1_k$ can be arranged to be coupled between the input terminal TM and the reference signal VR2. Additionally, or alternatively, when the comparison result CR indicates that the signal level at the input terminal TM is less than the signal level at the input terminal TP, the capacitor $CP1_k$ can be arranged to be coupled between the input terminal TP and the reference signal VR2. When the comparison result CR indicates that the signal level at the input terminal TM is greater than the signal level at the input terminal TP, the capacitor $CP2_k$ can be arranged to be coupled between the input terminal TP and the reference signal VR1.

For example, in a conversion step of the conversion phase, which may correspond to a bit cycle, the capacitor $CM1_{(N-1)}$ can be coupled between the input terminal TM and the reference signal VR1, and the capacitor $CM2_{(N-1)}$ can be coupled between the input terminal TM and the reference signal VR2. In addition, the capacitor $CP1_{(N-1)}$ can be coupled between the input terminal TP and the reference signal VR1, and the capacitor $CP2_{(N-1)}$ can be coupled between the input terminal TP and the reference signal VR2. The comparator 110 can compare the signal level at the input terminal TM and the signal level at the input terminal TP to generate the comparison result CR. When the comparison result CR indicates that the signal level at the input terminal TM is less than the signal level at the input terminal TP, the switch circuit 136.1 can couple the reference signal VR1 to the capacitor $CM2_{(N-1)}$ according to the digital signal SD1, and the switch circuit 138.1 can couple the reference signal VR2 to the capacitor $CP1_{(N-1)}$ according to the digital signal SD2. When the comparison result CR indicates that the signal level at the input terminal TM is greater than the signal level at the input terminal TP, the switch circuit 136.1 can couple the reference signal VR2 to the capacitor $CM1_{(N-1)}$ according to the digital signal SD1, and the switch circuit 138.1 can couple the reference signal VR1 to the capacitor $CP2_{(N-1)}$ according to the digital signal SD2.

Similarly, a reference signal coupled to the pair of capacitors $CPM_{(N-2)}$ may change according to the comparison result CR obtained in a next conversion step of the conversion phase. A reference signal coupled to the pair of capacitors $CPP_{(N-2)}$ may change according to the comparison result CR obtained in the next conversion step of the conversion phase.

With the use of the proposed signal conversion scheme, a capacitor coupled to the common-mode voltage VCM can be replaced with a pair of capacitors coupled to the reference signals VR1 and VR2, Compared with a DAC which includes a plurality of capacitors coupled to the common-mode voltage VCM during a conversion phase, the DAC 130 can greatly reduce power consumption caused by a power-hungry register for storing the common-mode voltage VCM since the number of times that the common-mode voltage VCM is accessed from the register can be reduced or equal to zero. In some embodiments, the DAC 130 may not need a register for storing the common-mode voltage VCM since signal conversion can be performed without the aid of the common-mode voltage VCM.

To facilitate understanding of the present disclosure, some embodiments are given as follows for further description of the proposed signal conversion scheme. Those skilled in the art should appreciate that other embodiments employing the switched-capacitor structure shown in FIG. 1 are also within the contemplated scope of the present disclosure.

Figure 2:
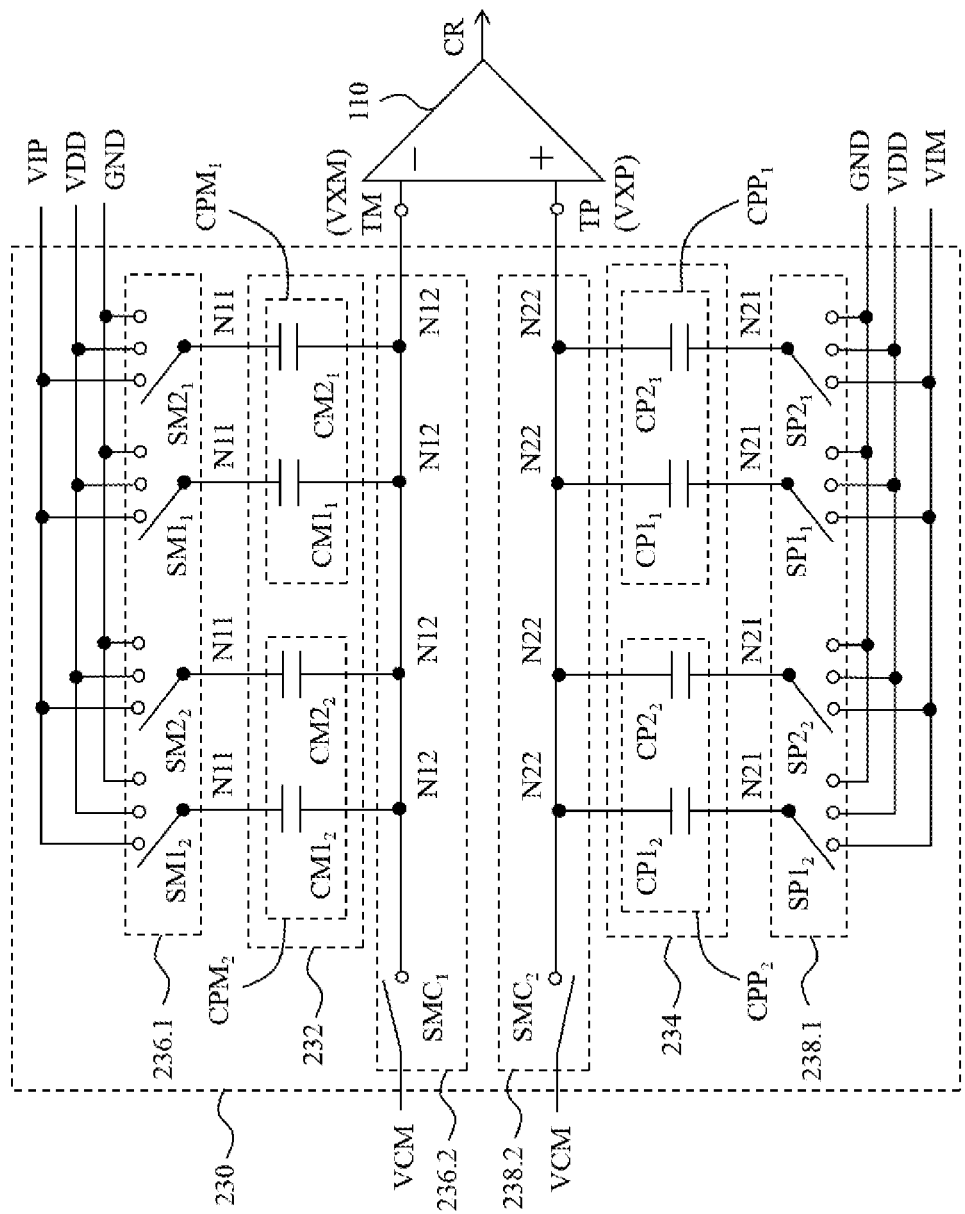
FIG. 2 illustrates an implementation of the DAC shown in FIG. 1 in accordance with some embodiments of the present disclosure.

FIG. 2 illustrates an implementation of the DAC 130 shown in FIG. 1 in accordance with some embodiments of the present disclosure. In the present embodiment, the DAC 230 can be implemented as a 2-bit DAC which uses a bottom-plate sampling scheme for illustrative purposes. The DAC 230 includes a plurality of switched capacitor arrays 232 and 234, and a plurality of switch circuits 236.1, 236.2, 238.1 and 238.2. The switched capacitor arrays 232 and 234 can represent embodiments of the switched capacitor arrays 132 and 134 shown in FIG. 1, respectively. The switch circuits 236.1, 236.2, 238.1 and 238.2 can represent embodiments of the switch circuits 136.1, 136.2, 138.1 and 138.2 shown in FIG. 1, respectively.

The switched capacitor array 232 includes the pairs of capacitors $CPM_1$ and $CPM_2$. The switched capacitor array 234 includes the pairs of capacitors $CPP_1$ and $CPP_2$. The switch circuit 236.1 is arranged to selectively couple the terminal N11 of each capacitor of the switched capacitor array 232 to one of the voltage signal VIP, a power supply voltage VDD and a ground voltage GND according to the digital signal SD1. The power supply voltage VDD and the ground voltage GND can represent embodiments of the reference signal VR1 and the reference signal VR2 shown in FIG. 1, respectively. The switch circuit 236.1 may include, but is not limited to, a plurality of switches $SM1_1$, $SM2_1$, $SM1_2$ and $SM2_2$. The switch circuit 236.2 is arranged to selectively couple the terminal N12 of each capacitor of the switched capacitor array 232 to the common-mode voltage VCM. The switch circuit 236.2 can be implemented using, but not limited to, a switch $SMC_1$. In some embodiments, the signal level of the common-mode voltage VCM is equal to an average of a signal level of the power supply voltage VDD and a signal level of the ground voltage GND.

The switch circuit 238.1 is arranged to selectively couple the terminal N21 of each capacitor of the switched capacitor array 234 to one of the voltage signal VIM, the power supply voltage VDD and the ground voltage GND according to the digital signal SD2. The switch circuit 238.1 may include, but is not limited to, a plurality of switches $SP1_1$, $SP2_1$, $SP1_2$ and $SP2_2$. The switch circuit 238.2 is arranged to selectively couple the terminal N22 of each capacitor of the switched capacitor array 234 to the common-mode voltage VCM. The switch circuit 238.2 can be implemented using, but not limited to, a switch $SMC_2$.

Figure 3A:
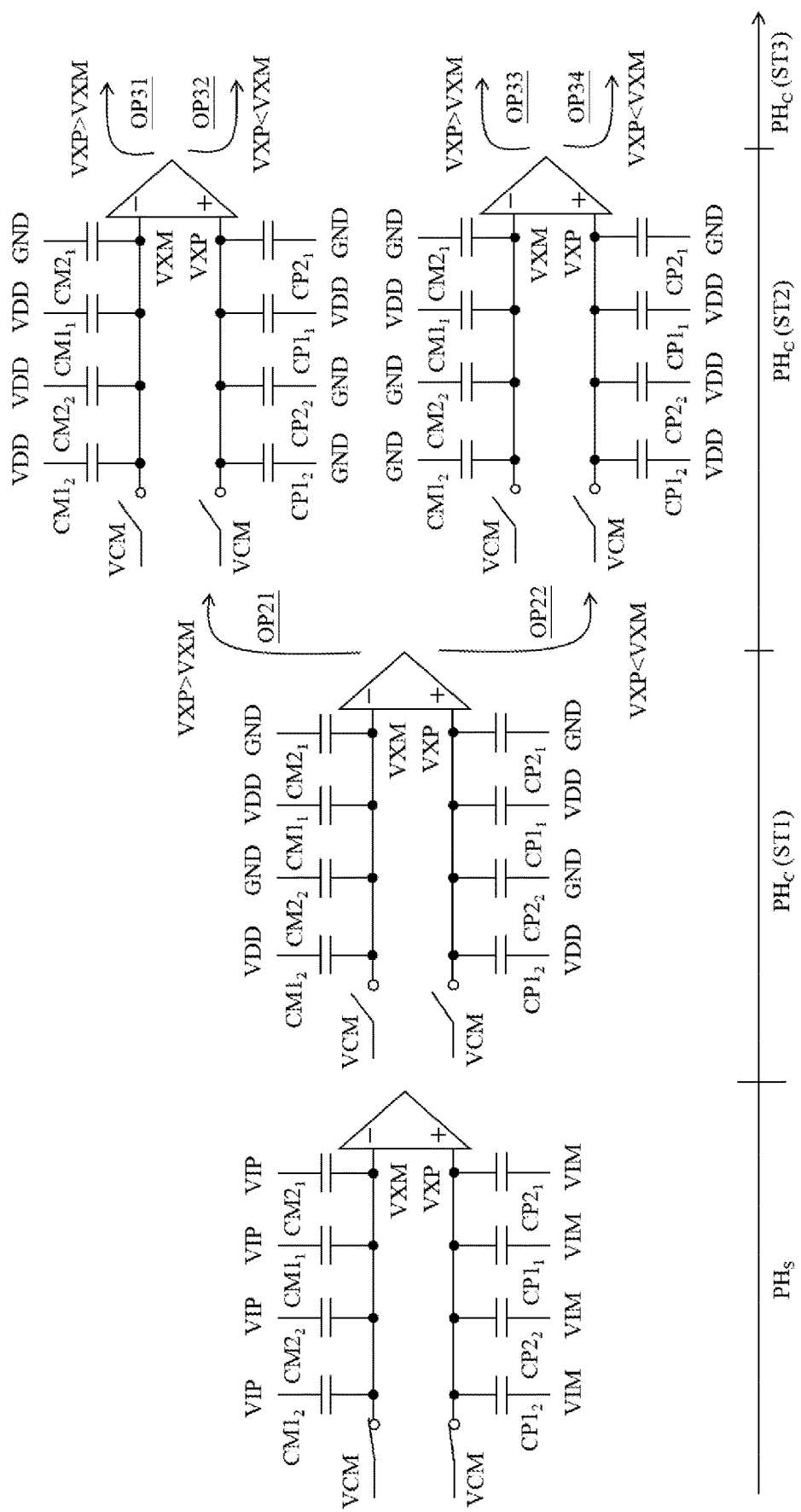
FIG. 3A and FIG. 3B illustrate exemplary operation of the DAC shown in FIG. 2 in accordance with some embodiments of the present disclosure.
Figure 3B:
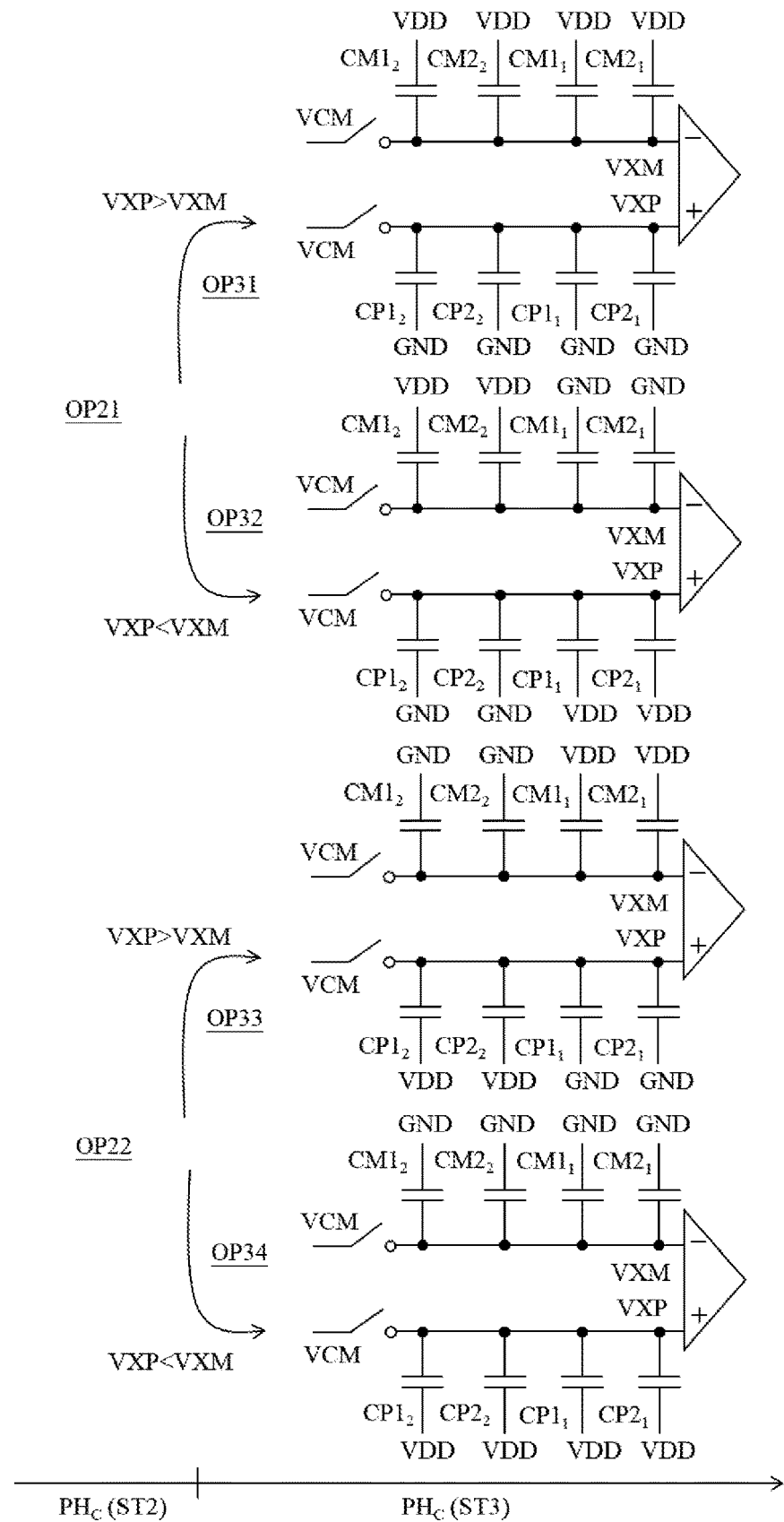

FIG. 3A and FIG. 3B illustrate exemplary operation of the DAC 230 shown in FIG. 2 in accordance with some embodiments of the present disclosure. Referring firstly to FIG. 3A and also to FIG. 2, during a sampling phase $PH_S$ in a conversion cycle, each capacitor of the switched capacitor array 232 is coupled between the voltage signal VIP and the common-mode voltage VCM, and each capacitor of the switched capacitor array 234 is coupled between the voltage signal VIM and the common-mode voltage VCM. For example, each of the switches $SM1_1$, $SM2_1$, $SM1_2$ and $SM2_2$ is configured to couple the voltage signal VIP to the terminal N11 of a corresponding capacitor, and the switch $SMC_1$ is configured to couple the common-mode voltage VCM to the input terminal TM. In addition, each of the switches $SP1_1$, $SP2_1$, $SP1_2$ and $SP2_2$ is configured to couple the voltage signal VIM to the terminal N21 of a corresponding capacitor, and the switch $SMC_2$ is configured to couple the common-mode voltage VCM to the input terminal TP. As a result, respective signal levels of the voltage signals VXM and VXP can be equal to that of the common-mode voltage VCM during the sampling phase $PH_S$.

During a conversion phase $PH_C$, after the sampling phase $PH_S$, each capacitor of the switched capacitor array 232 is coupled between the input terminal TM and one of the power supply voltage VDD and the ground voltage GND. In addition, each capacitor of the switched capacitor array 234 is coupled between the input terminal TP and one of the power supply voltage VDD and the ground voltage GND. For example, in a conversion step ST1 of the conversion phase $PH_C$, two capacitors in a same pair of capacitors are coupled to the power supply voltage VDD and the ground voltage GND, respectively. With regard to the pair of capacitors $CPM_1$ and $CPM_2$, each of the capacitors $CM1_1$ and $CM1_2$ is coupled between the input terminal TM and the power supply voltage VDD, and each of the capacitors $CM2_1$ and $CM2_2$ is coupled between the input terminal TM and the ground voltage GND. With regard to the pair of capacitors $CPP_1$ and $CPP_2$, each of the capacitors $CP1_1$ and $CP1_2$ is coupled between the input terminal TP and the power supply voltage VDD, and each of the capacitors $CP2_1$ and $CP2_2$ is coupled between the input terminal TP and the ground voltage GND.

For example, each of the switches $SM1_1$ and $SM1_2$ is configured to couple the power supply voltage VDD to the terminal N11 of a corresponding capacitor, each of the switches $SM2_1$ and $SM2_2$ is configured to couple the ground voltage GND to the terminal N11 of a corresponding capacitor, and the switch $SMC_1$ is switched off. Additionally, each of the switches $SP1_1$ and $SP1_2$ is configured to couple the power supply voltage VDD to the terminal N21 of a corresponding capacitor, each of the switches $SP2_1$ and $SP2_2$ is configured to couple the ground voltage GND to the terminal N21 of a corresponding capacitor, and the switch $SMC_2$ is switched off.

Further, in the conversion step ST1, the comparator 110 can be configured to compare the voltage signal VXM and the voltage signal VXP to generate the comparison result CR. It is worth noting that as two capacitors, having a same capacitance value, in each pair of capacitors are coupled to the power supply voltage VDD and the ground voltage GND respectively, a result of comparison between the voltage signal VXM and the voltage signal VXP is equal to or substantially equal to a result of comparison between the voltage signal VIM and the voltage signal VIP, which can be expressed as: VXP−VXM=VIP−VIM. In other words, the DAC 230 can be employed in a differential SAR ADC for converting the input signal AIN including the voltage signals VIP and VIM.

When the comparison result CR indicates that the signal level of the voltage signal VXM is less than the signal level of the voltage signal VXP, the DAC 230 may enter an operational state OP21 in a conversion step ST2. When the comparison result CR indicates that the signal level of the voltage signal VXM is greater than the signal level of the voltage signal VXP, the DAC 230 may enter an operational state OP22 in the conversion step ST2.

In the operational state OP21, the capacitor $CM2_2$ is coupled between the power supply voltage VDD and the input terminal TM, and the capacitor $CP1_2$ is coupled between the ground voltage GND and the input terminal TP, For example, the switch $SM2_2$ is configured to couple the power supply voltage VDD to the terminal N11 of the capacitor $CM2_2$, and the switch $SP1_2$ is configured to couple the ground voltage GND to the terminal N21 of the capacitor $CP1_2$. Next, the comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 230 may enter an operational state OP31 in a conversion step ST3. When the comparison result CR indicates that the signal level of the voltage signal VXM is greater than the signal level of the voltage signal VXP, the DAC 230 may enter an operational state OP32 in the conversion step ST3.

In the operational state OP22, the capacitor $CM1_2$ is coupled between the ground voltage GND and the input terminal TM, and the capacitor $CP2_2$ is coupled between the power supply voltage VDD and the input terminal TP. For example, the switch $SM1_2$ is configured to couple the ground voltage GND to the terminal N11 of the capacitor $CM1_2$, and the switch $SP2_2$ is configured to couple the power supply voltage VDD to the terminal N21 of the capacitor $CP2_2$. Next, the comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 230 may enter an operational state OP33 in the conversion step ST3. When the comparison result CR indicates that the signal level of the voltage signal VXM is greater than the signal level of the voltage signal VXP, the DAC 230 may enter an operational state OP34 in the conversion step ST3.

Referring to FIG. 3B and also to FIG. 2, in the operational state OP31, the capacitor $CM2_1$ is coupled between the power supply voltage VDD and the input terminal TM, and the capacitor $CP1_1$ is coupled between the ground voltage GND and the input terminal TP. For example, the switch $SM2_1$ is configured to couple the power supply voltage VDD to the terminal N11 of the capacitor $CM2_1$ and the switch $SP1_1$ is configured to couple the ground voltage GND to the terminal N21 of the capacitor $CP1_1$. In the operational state OP32, the capacitor $CM1_1$ is coupled between the ground voltage GND and the input terminal TM, and the capacitor $CP2_1$ is coupled between the power supply voltage VDD and the input terminal TP. For example, the switch $SM1_1$ is configured to couple the ground voltage GND to the terminal N11 of the capacitor $CM1_1$, and the switch $SP2_1$ is configured to couple the power supply voltage VDD to the terminal N21 of the capacitor $CP2_1$.

Similarly, in the operational state OP33, the capacitor $CM2_1$ is coupled between the power supply voltage VDD and the input terminal TM, and the capacitor $CP1_1$ is coupled between the ground voltage GND and the input terminal TP. In the operational state OP34, the capacitor $CM1_1$ is coupled between the ground voltage GND and the input terminal TM, and the capacitor $CP2_1$ is coupled between the power supply voltage VDD and the input terminal TP. Based on the operation shown in FIG. 3A and FIG. 3B, the DAC 230 shown in FIG. 2 can be used to implement a 3-bit SAR ADC which uses a binary search algorithm to perform signal conversion.

Figure 3C:
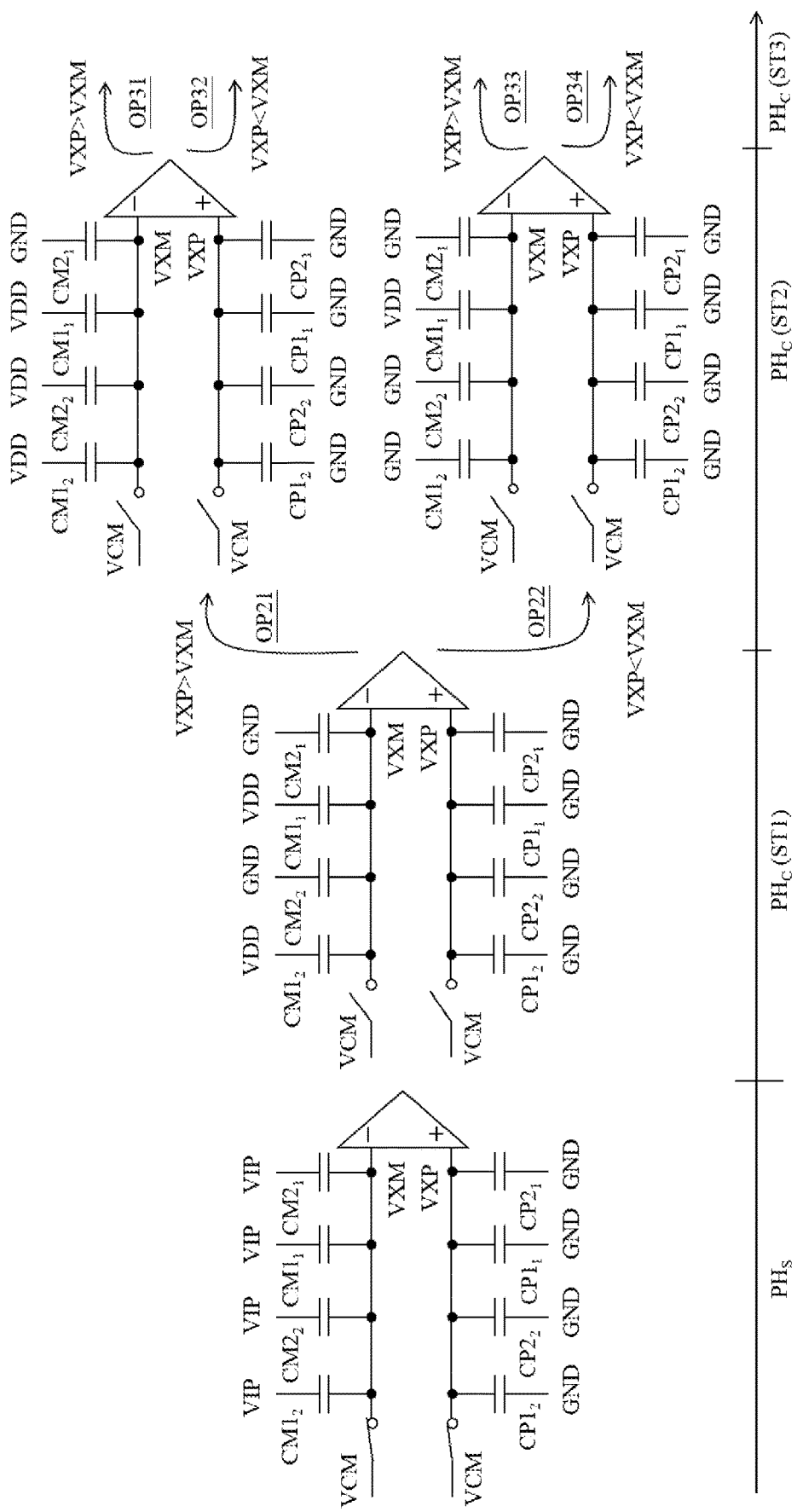
FIG. 3C and FIG. 3D illustrate exemplary operation of the DAC shown in FIG. 2 in accordance with some embodiments of the present disclosure.
Figure 3D:
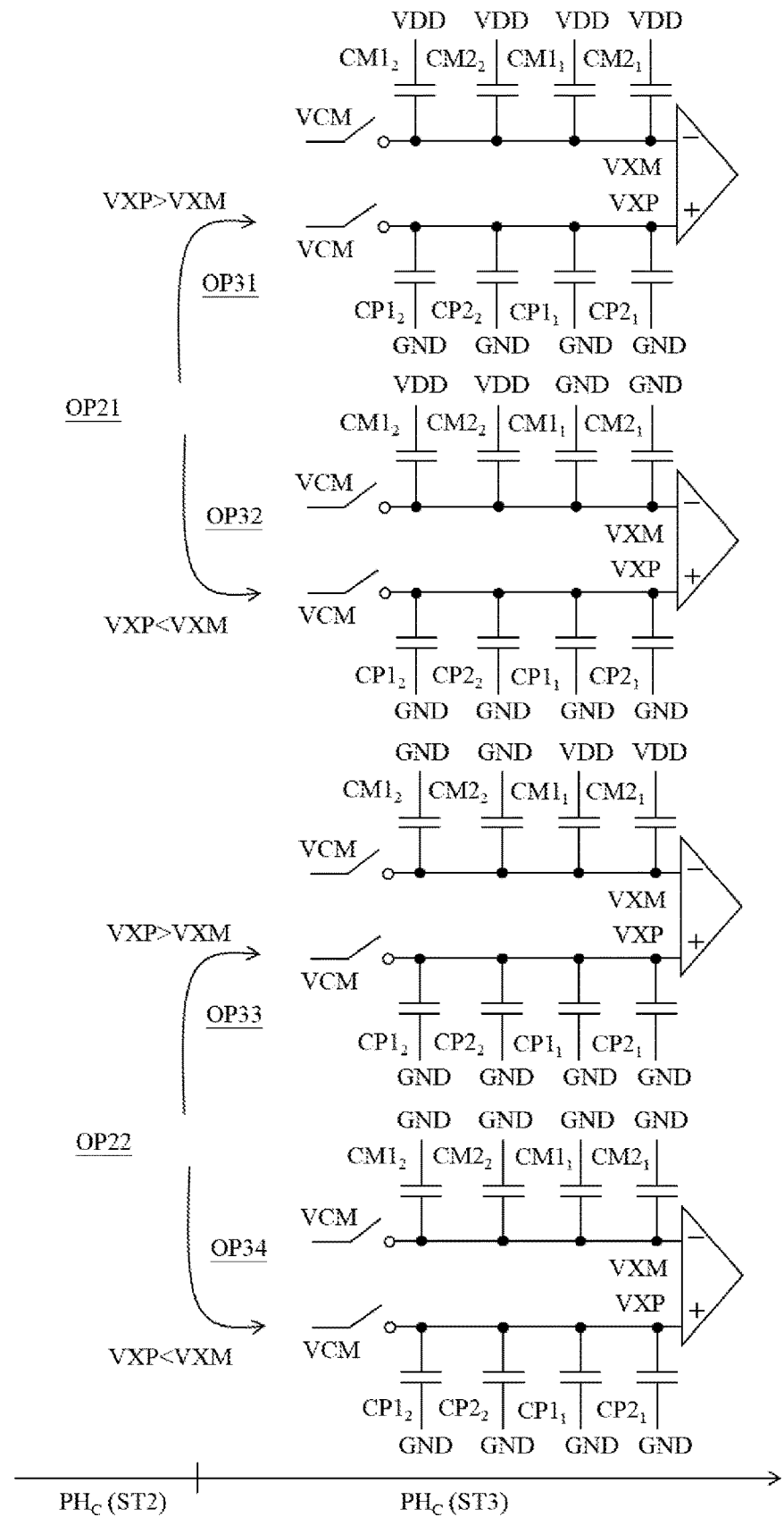

In some embodiments, the DAC 230 shown in FIG. 2 can be used to implement a 3-bit SAR ADC which operates in a single-ended mode to convert the input signal AIN. FIG. 3C and FIG. 3D illustrate exemplary operation of the DAC 230 shown in FIG. 2 in accordance with some embodiments of the present disclosure. In the embodiments shown in FIG. 3C and FIG. 3D, the input signal AIN is a single-ended signal which is implemented using, but not limited to, the voltage signal VIP. The operation shown in FIG. 3C and FIG. 3D is similar/identical to the operation shown in FIG. 3A and FIG. 3B except that, for example, each of the capacitors $CP1_1$, $CP2_1$, $CP1_2$ and $CP2_2$ is coupled to a same reference signal during the sampling phase $PH_S$ and the conversion phase $PH_C$.

Referring firstly to FIG. 3C and also to FIG. 2, during the sampling phase $PH_S$, each capacitor of the switched capacitor array 232 is coupled between the voltage signal VIP and the common-mode voltage VCM, and each capacitor of the switched capacitor array 234 is coupled between the common-mode voltage VCM and the ground voltage GND. For example, each of the switches $SP1_1$, $SP2_1$, $SP1_2$ and $SP2_2$ is configured to couple the ground voltage GND to the terminal N21 of a corresponding capacitor, and the switch $SMC_2$ is configured to couple the common-mode voltage VCM to the input terminal TP.

During the conversion phase $PH_C$, each capacitor of the switched capacitor array 232 is coupled between the input terminal TM and one of the power supply voltage VDD and the ground voltage GND, while each capacitor of the switched capacitor array 234 can be kept coupled between the input terminal TP and the ground voltage GND. In the conversion step ST1, the comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 230 may enter the operational state OP21 in the conversion step ST2. When the comparison result CR indicates that the signal level of the voltage signal VXM is greater than the signal level of the voltage signal VXP, the DAC 230 may enter the operational state OP22 in the conversion step ST2. It is worth noting that a result of comparison between the voltage signal VXP and the voltage signal VXM is equal to or substantially equal to a result of comparison between the voltage signal VIP and the ground voltage GND. As a result, the DAC 230 can be employed in a single-ended SAR ADC.

In the operational state OP21, the switch $SM2_2$ is configured to couple the power supply voltage VDD to the terminal N11 of the capacitor $CM2_2$, while each of the switches $SP1_2$ and $SP2_2$ is kept coupled between the ground voltage GND and a corresponding capacitor. The comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 230 may enter the operational state OP31 in the conversion step ST3. When the comparison result CR indicates that the signal level of the voltage signal VXM is greater than the signal level of the voltage signal VXP, the DAC 230 may enter an operational state OP32 in the conversion step ST3.

In the operational state OP22, the switch $SM1_2$ is configured to couple the ground voltage GND to the terminal N11 of the capacitor $CM1_2$, while each of the switches $SP1_2$ and $SP2_2$ is kept coupled between the ground voltage GND and a corresponding capacitor. The comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 230 may enter the operational state OP33 in the conversion step ST3. When the comparison result CR indicates that the signal level of the voltage signal VXM is greater than the signal level of the voltage signal VXP, the DAC 230 may enter an operational state OP34 in the conversion step ST3.

Referring to FIG. 3D and also to FIG. 2, in the operational states OP31 and OP33, the switch SM$2_1$ is configured to couple the power supply voltage VDD to the terminal N11 of the capacitor CM$2_1$. In the operational states OP32 and OP34, the switch SM$1_1$ is configured to couple the ground voltage GND to the terminal N11 of the capacitor CM$1_1$. As those skilled in the art can appreciate the operation of the DAC 230 in the conversion step ST3 shown in FIG. 3D after reading the above paragraphs directed to FIG. 1 to FIG. 3C, further description is omitted here for brevity. Based on the operation shown in FIG. 3C and FIG. 3D, the DAC 230 shown in FIG. 2 can be used to implement a 3-bit SAR ADC operating in a single-ended mode.

The DAC structure and operation described above are provided for illustrative purposes, and are not intended to limit the scope of the present disclosure. In some embodiments, the common-mode voltage VCM may be implemented using a reference signal different from each of the reference signals VR1 and VR2. In some embodiments, a pair of capacitors corresponding to a predetermined bit of the output signal DOUT may be replaced with a single capacitor, which is coupled between the voltage signal VIP/VIM and the common-mode voltage VCM during the sampling phase PH$_S$, and coupled between the common-mode voltage VCM and the input terminal TM/TP at the beginning of the conversion phase PH$_C$. In some embodiments, a pair of capacitors may be coupled to the power supply voltage VDD and the ground voltage GND, rather than the common-mode voltage VCM, during the sampling phase PH$_S$. As long as a DAC can provide at least one pair of capacitors with a same capacitance value to replace a capacitor which is electrically connected to a common-mode voltage, and capacitors in the pair of capacitors are coupled to reference signals different from the common-mode voltage, associated modifications and alternatives are contemplated to fall within the scope of the present disclosure.

Figure 4:
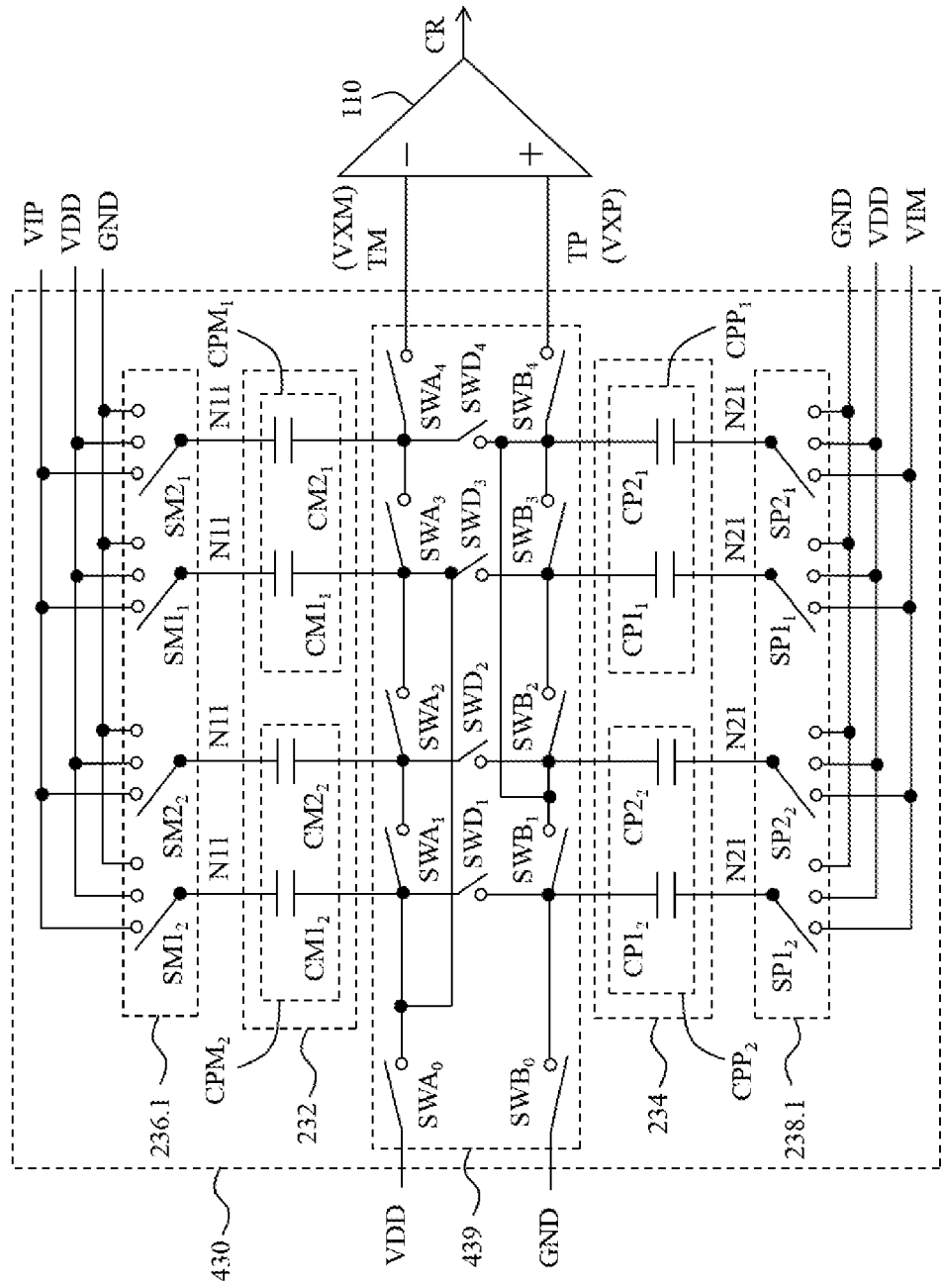
FIG. 4 illustrates another implementation of the DAC shown in FIG. 1 in accordance with some embodiments of the present disclosure.

FIG. 4 illustrates another implementation of the DAC 130 shown in FIG. 1 in accordance with some embodiments of the present disclosure. The structure of the DAC 430 is similar/identical to the structure of the DAC 230 shown in FIG. 2 except for the switch circuit 439. In the present embodiment, the switch circuit 439 is arranged to couple two capacitors in a pair of capacitors to the power supply voltage VDD and the ground voltage GND respectively, or couple the two capacitors to a same input terminal of the comparator 110.

Figure 5A:
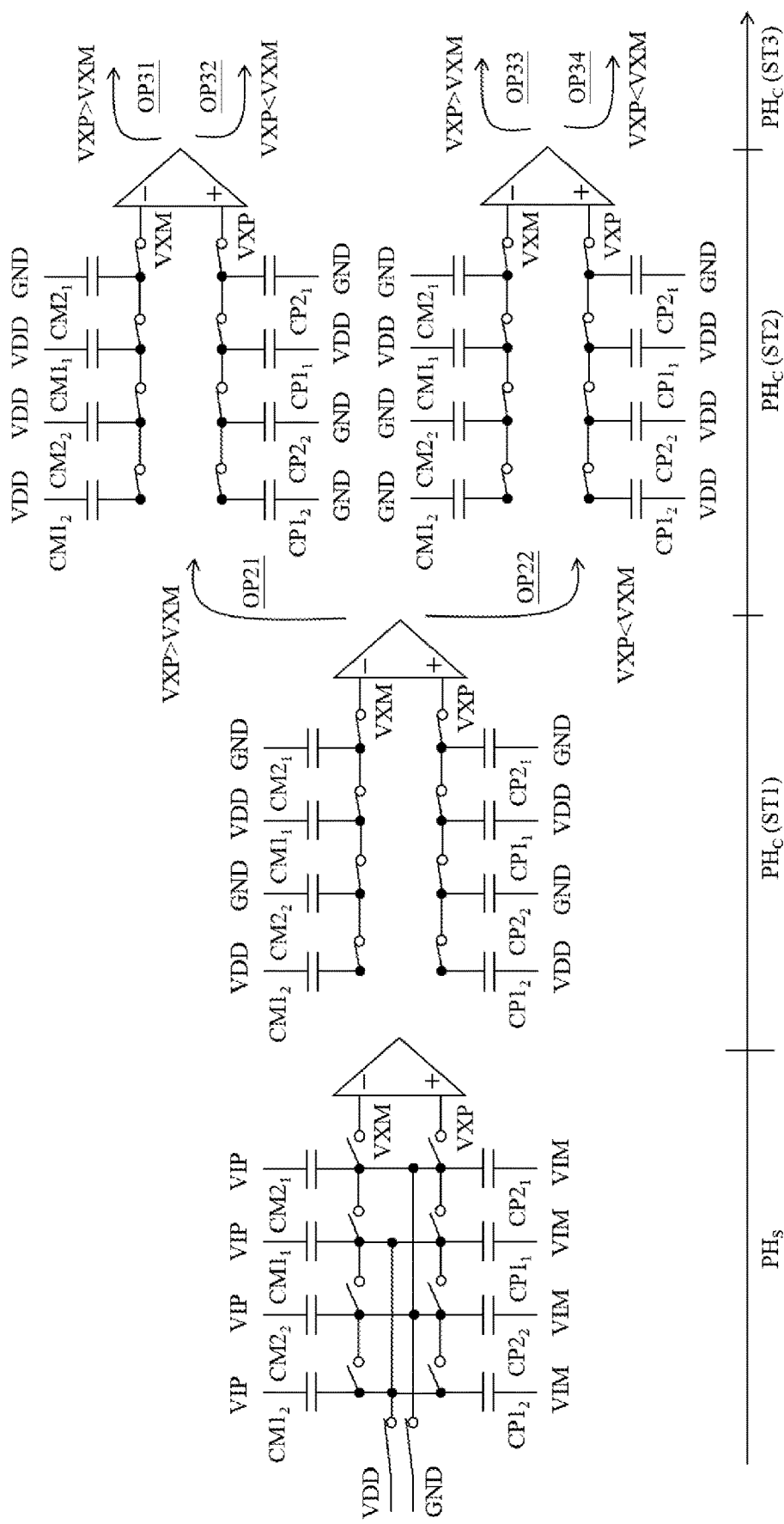
FIG. 5A and FIG. 5B illustrate exemplary operation of the DAC shown in FIG. 4 in accordance with some embodiments of the present disclosure.
Figure 5B:
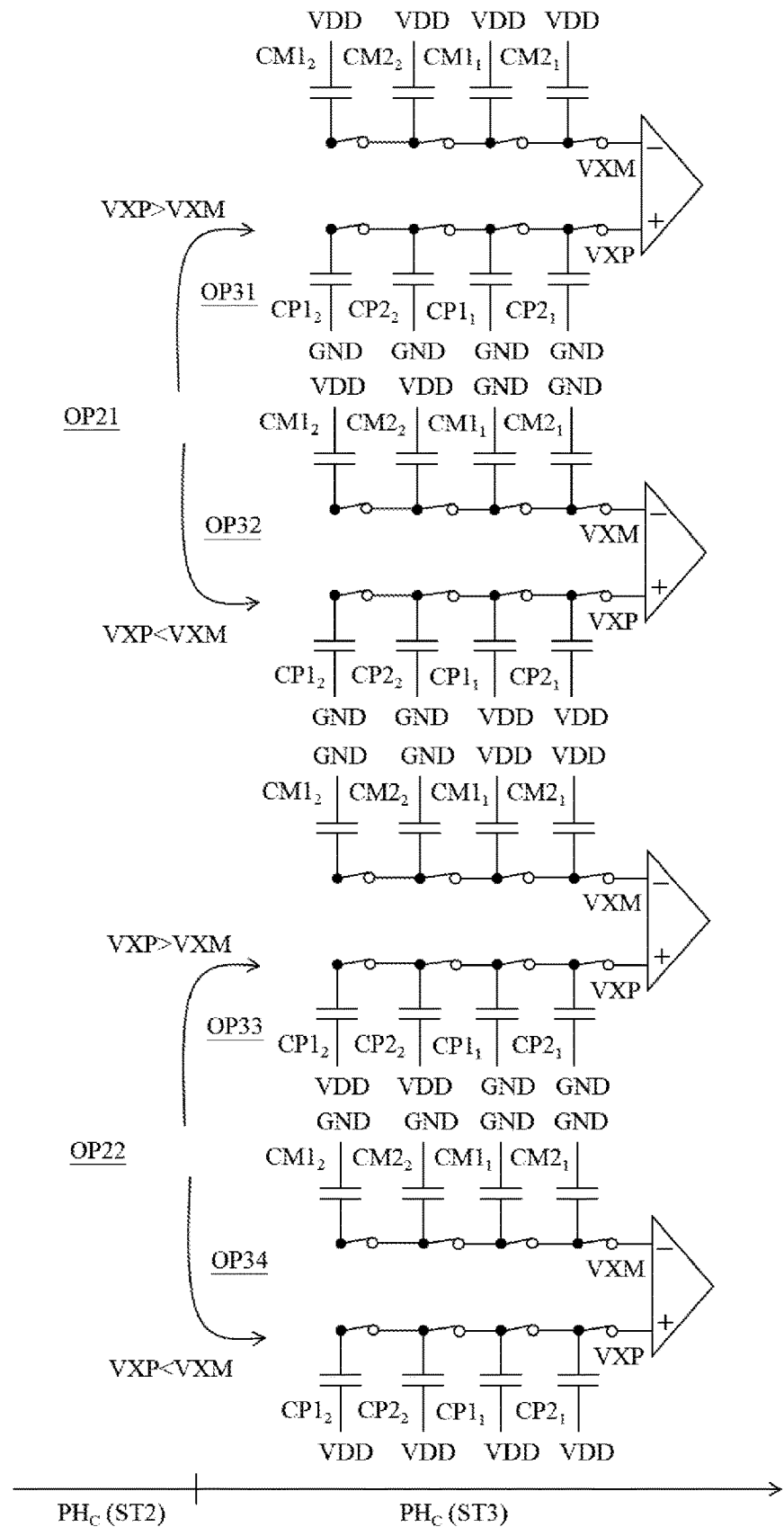

FIG. 5A and FIG. 5B illustrate exemplary operation of the DAC 430 shown in FIG. 4 in accordance with some embodiments of the present disclosure. Referring firstly to FIG. 5A and also to FIG. 4, during the sampling phase PH$_S$, one capacitor in each pair of capacitors of the switched capacitor array 232 is coupled between the voltage signal VIP and the power supply voltage VDD, and the other capacitor in the pair of capacitors is coupled between the voltage signal VIP and the ground voltage GND. In addition, one capacitor in each pair of capacitors of the switched capacitor array 234 is coupled between the voltage signal VIM and the power supply voltage VDD, and the other capacitor in the pair of capacitors is coupled between the voltage signal VIM and the ground voltage GND.

For example, the switch circuit 439 may include a plurality of switches SWA$_0$-SWA$_4$, SWB$_0$-SWB$_4$ and SWD$_1$-SWD$_4$. During the sampling phase PH$_S$, each of the switches SM$1_1$, SM$2_1$, SM$1_2$ and SM$2_2$ is configured to couple the voltage signal VIP to the terminal N11 of a corresponding capacitor. Each of the switches SWA$_0$, SWB$_0$ and SWD$_1$-SWD$_4$ is switched on, and each of the switches SWA$_1$-SWA$_4$ and SWB$_1$-SWB$_4$ is switched off. As a result, each of the capacitors CM$1_1$ and CM$1_2$ is coupled between the voltage signal VIP and the power supply voltage VDD, and each of the capacitors CM$2_1$ and CM$2_2$ is coupled between the voltage signal VIP and the ground voltage GND. Also, each of the capacitors CP$1_1$ and CP$1_2$ is coupled between the voltage signal VIM and the power supply voltage VDD, and each of the capacitors CP$2_1$ and CP$2_2$ is coupled between the voltage signal VIM and the ground voltage GND.

During the conversion phase PH$_C$, each capacitor of the switched capacitor array 232 is coupled between the input terminal TM and one of the power supply voltage VDD and the ground voltage GND. In addition, each capacitor of the switched capacitor array 234 is coupled between the input terminal TP and one of the power supply voltage VDD and the ground voltage GND. For example, in the conversion step ST1, each of the switches SM$1_1$ and SM$1_2$ is configured to couple the power supply voltage VDD to the terminal N11 of a corresponding capacitor, and each of the switches SM$2_1$ and SM$2_2$ is configured to couple the ground voltage GND to the terminal N11 of a corresponding capacitor, Each of the switches SP$1_1$ and SP$1_2$ is configured to couple the power supply voltage VDD to the terminal N21 of a corresponding capacitor, and each of the switches SP$2_1$ and SP$2_2$ is configured to couple the ground voltage GND to the terminal N21 of a corresponding capacitor, In addition, each of the switches SWA$_0$, SWB$_0$ and SWD$_1$-SWD$_4$ is switched off, and each of the switches SWA$_1$-SWA$_4$ and SWB$_1$-SWB$_4$ is switched on.

Further, in the conversion step ST1, the comparator 110 can be configured to compare the voltage signal VXM and the voltage signal VXP to generate the comparison result CR. It is worth noting that a result of comparison between the voltage signal VXM and the voltage signal VXP is equal to or substantially equal to a result of comparison between the voltage signal VIM and the voltage signal VIP, which can be expressed as: VXP−VXM=VIP−VIM. As a result, the DAC 430 can be employed in a differential SAR ADC for converting the input signal AIN including the voltage signals VIP and VIM. As those skilled in the art can appreciate the operation of the DAC 430 in the conversion steps ST1-ST3 shown in FIG. 5A and FIG. 5B after reading the above paragraphs directed to FIG. 1 to FIG. 3B, further description is omitted here for brevity. Additionally, in some embodiments, the DAC 430 shown in FIG. 4 can be used to implement a SAR ADC, operating in a single-ended mode, based on the operation described with reference to FIG. 3C and FIG. 3D without departing from the scope of the present disclosure.

Figure 6:
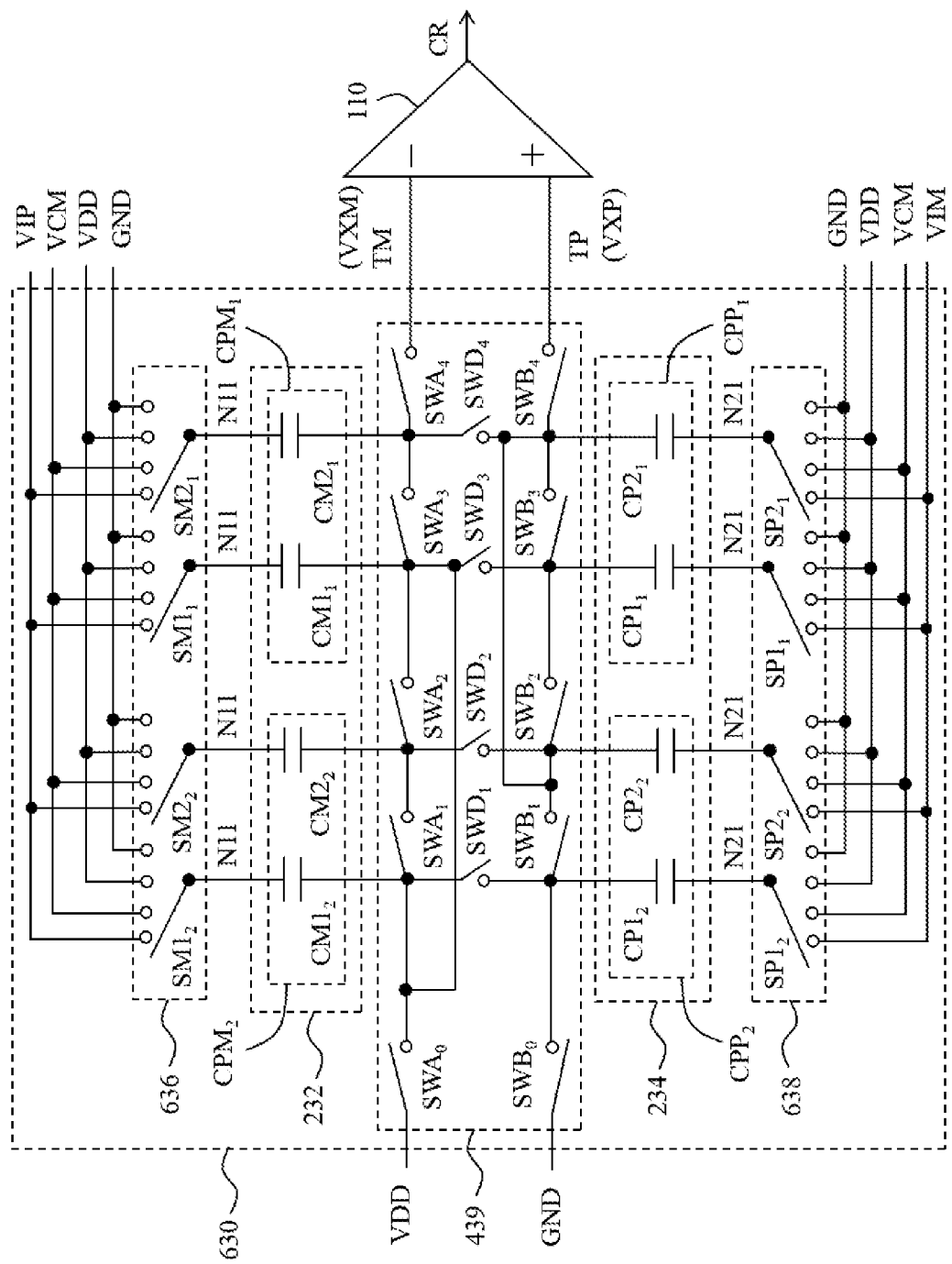
FIG. 6 illustrates another implementation of the DAC shown in FIG. 1 in accordance with some embodiments of the present disclosure.

In some embodiments, at least one pair of capacitors shown in FIG. 4, coupled to the power supply voltage VDD and the ground voltage GND during the sampling phase PH$_S$, can be coupled to a common-mode voltage at the beginning of the conversion phase PH$_C$. FIG. 6 illustrates another implementation of the DAC 130 shown in FIG. 1 in accordance with some embodiments of the present disclosure. The structure of the DAC 630 is similar/identical to the structure of the DAC 430 shown in FIG. 4 except for the switch circuits 636 and 638. The switch circuits 636 and 638 can represent embodiments of the switch circuits 136.1 and 138.1 shown in FIG. 1, respectively.

In the present embodiment, the switch circuit 636 is arranged to selectively couple the terminal N11 of each capacitor of the switched capacitor array 232 to one of the voltage signal VIP, the common-mode voltage VCM, the power supply voltage VDD and the ground voltage GND according to the digital signal SD1. The switch circuit 636 may be implemented using the switches $SM1_1$, $SM2_1$, $SM1_2$, and $SM2_2$ shown in FIG. 2. The switch circuit 638 is arranged to selectively couple the terminal N21 of each capacitor of the switched capacitor array 234 to one of the voltage signal VIM, the common-mode voltage VCM, the power supply voltage VDD and the ground voltage GND according to the digital signal SD2. The switch circuit 638 may be implemented using the switches $SP1_1$, $SP2_1$, $SP1_2$, and $SP2_2$ shown in FIG. 2.

Figure 7:
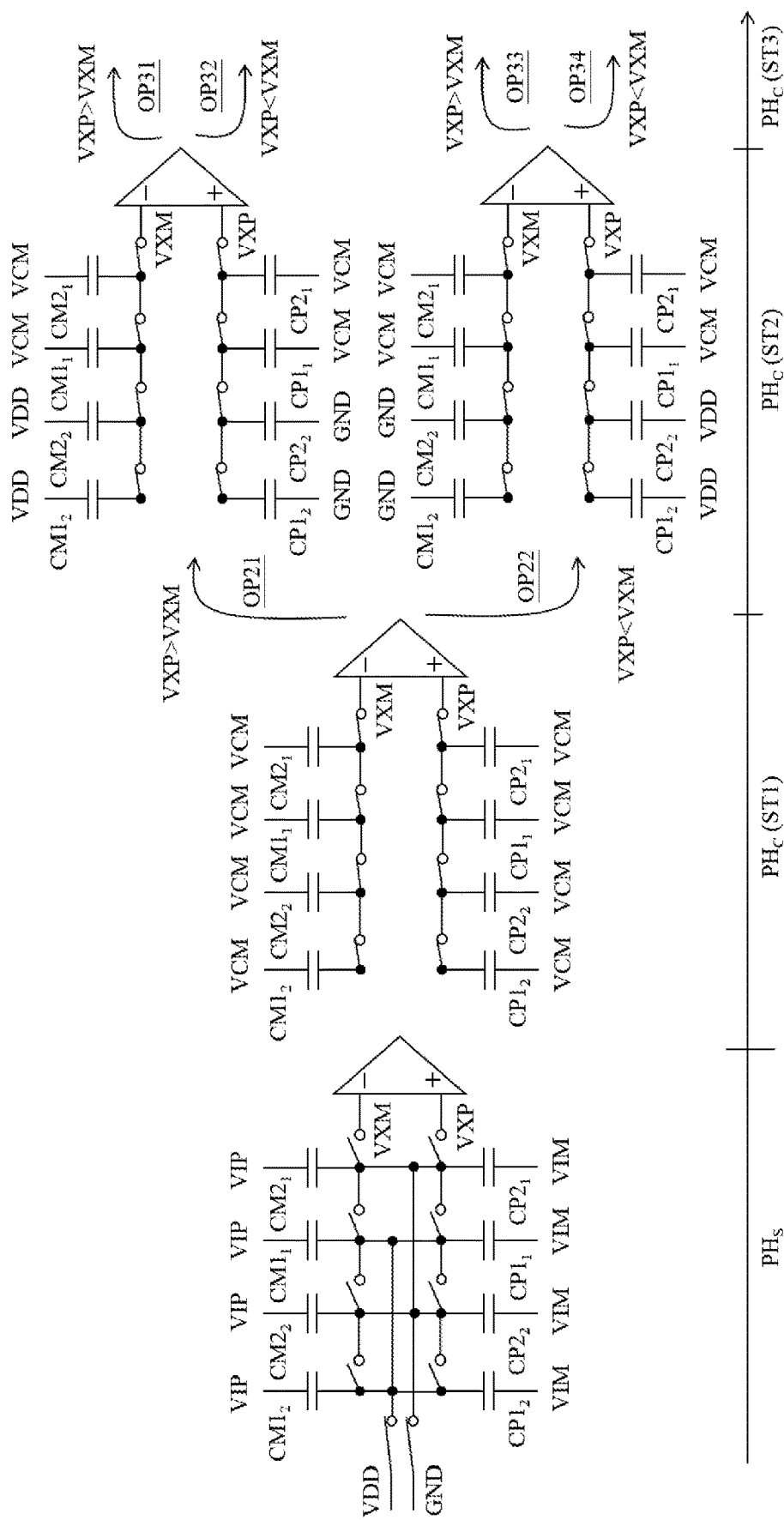
FIG. 7 illustrates exemplary operation of the DAC shown in FIG. 6 in accordance with some embodiments of the present disclosure.

FIG. 7 illustrates exemplary operation of the DAC 630 shown in FIG. 6 in accordance with some embodiments of the present disclosure. Referring to FIG. 7 and also to FIG. 6, during the sampling phase $PH_S$, the operation of the DAC 630 can be similar/identical to that of the DAC 430 shown in FIG. 4. During the conversion phase $PH_C$, each capacitor of the switched capacitor array 232 can be coupled between the input terminal TM and the common-mode voltage VCM. Each capacitor of the switched capacitor array 234 can be coupled between the input terminal TP and the common-mode voltage VCM. For example, in the conversion step ST1, each of the switches $SM1_1$, $SM2_1$, $SM1_2$ and $SM2_2$ is configured to couple the common-mode voltage VCM to the terminal N11 of a corresponding capacitor, and each of the switches $SP1_1$, $SP2_1$, $SP1_2$ and $SP2_2$ is configured to couple the common-mode voltage VCM to the terminal N21 of a corresponding capacitor. Additionally, each of the switches $SWA_0$, $SWB_0$ and $SWD_1$-$SWD_4$ is switched off, and each of the switches $SWA_1$-$SWA_4$ and $SWB_1$-$SWB_4$ is switched on.

Further, in the conversion step ST1, the comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 630 may enter the operational state OP21 in the conversion step ST2, When the comparison result CR indicates that the signal level of the voltage signal VXM is greater than the signal level of the voltage signal VXP, the DAC 630 may enter the operational state OP22 in the conversion step ST2. It is worth noting that a result of comparison between the voltage signal VXM and the voltage signal VXP is equal to or substantially equal to a result of comparison between the voltage signal VIM and the voltage signal VIP, which can be expressed as: VXP−VXM=VIP−VIM. As a result, the DAC 630 can be employed in a differential SAR ADC for converting the input signal AIN including the voltage signals VIP and VIM.

In the operational state OP21, each of the capacitors $CM1_2$ and $CM2_2$ is coupled between the power supply voltage VDD and the input terminal TM, and each the capacitors $CP1_2$ and $CP2_2$ is coupled between the ground voltage GND and the input terminal TP. For example, each of the switches $SM1_2$ and $SM2_2$ is configured to couple the power supply voltage VDD to the terminal N11 of a corresponding capacitor, and each of the switches $SP1_2$ and $SP2_2$ is configured to couple the ground voltage GND to the terminal N21 of a corresponding capacitor. Next, the comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 630 may enter the operational state OP31 in a conversion step ST3. When the comparison result CR indicates that the signal level of the voltage signal VXM is greater than the signal level of the voltage signal VXP, the DAC 630 may enter the operational state OP32 in the conversion step ST3.

In the operational state OP22, each of the capacitors $CM1_2$ and $CM2_2$ is coupled between the ground voltage GND and the input terminal TM, and each the capacitors $CP1_2$ and $CP2_2$ is coupled between the power supply voltage VDD and the input terminal TP. For example, each of the switches $SM1_2$ and $SM2_2$ is configured to couple the ground voltage GND to the terminal N11 of a corresponding capacitor, and each of the switches $SP1_2$ and $SP2_2$ is configured to couple the power supply voltage VDD to the terminal N21 of a corresponding capacitor. Next, the comparator 110 can be configured to compare the voltage signal VXM and the voltage signal VXP to generate the comparison result CR. When the comparison result CR indicates that the signal level of the voltage signal VXM is less than the signal level of the voltage signal VXP, the DAC 630 may enter the operational state OP33 in the conversion step ST3. When the comparison result CR indicates that the signal level of the voltage signal VXM is greater than the signal level of the voltage signal VXP, the DAC 630 may enter the operational state OP34 in the conversion step ST3.

As those skilled in the art can appreciate that the operation of the DAC 630 in the operational states OP31-OP34 is similar/identical to that shown in FIG. 5B after reading the above paragraphs directed to FIG. 1 to FIG. 6, further description is omitted here for brevity. Additionally, in some embodiments, the DAC 630 can be used to implement a SAR ADC, operating in a single-ended mode, based on the operation described with reference to FIG. 3C and FIG. 3D without departing from the scope of the present disclosure.

Figure 8:
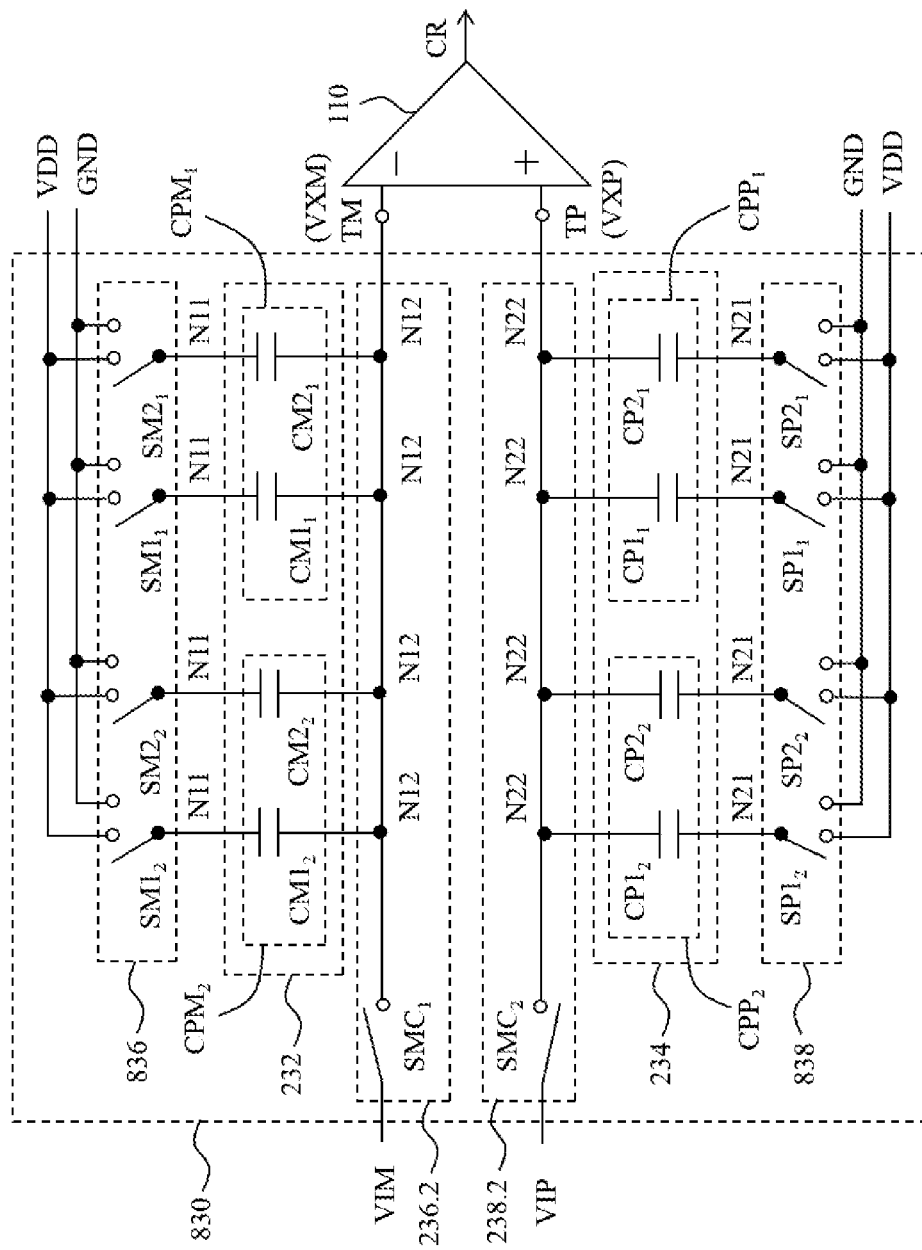
FIG. 8 illustrates another implementation of the DAC shown in FIG. 1 in accordance with some embodiments of the present disclosure.

FIG. 8 illustrates another implementation of the DAC 130 shown in FIG. 1 in accordance with some embodiments of the present disclosure. The structure of the DAC 830 is similar/identical to the structure of the DAC 230 shown in FIG. 2 except that, for example, the DAC 830 uses a top-plate sampling scheme to perform signal conversion. The switch circuits 836 and 838 included in the DAC 830 can represent embodiments of the switch circuits 136.1 and 138.1 shown in FIG. 1, respectively.

In the present embodiment, the switch circuit 836 is arranged to selectively couple the terminal N11 of each capacitor of the switched capacitor array 232 to one of the power supply voltage VDD and the ground voltage GND according to the digital signal SD1. The switch circuit 836 may be implemented using the switches $SM1_1$, $SM2_1$, $SM1_2$, and $SM2_2$ shown in FIG. 2. The switch circuit 838 is arranged to selectively couple the terminal N21 of each capacitor of the switched capacitor array 234 to one of the power supply voltage VDD and the ground voltage GND according to the digital signal SD2. The switch circuit 838 may be implemented using the switches $SP1_1$, $SP2_1$, $SP1_2$, and $SP2_2$ shown in FIG. 2. In addition, the switch $SMC_1$ is selectively coupled between the voltage signal VIM and the input terminal TM, and the switch $SMC_2$ is selectively coupled between the voltage signal VIP and the input terminal TP.

Figure 9:
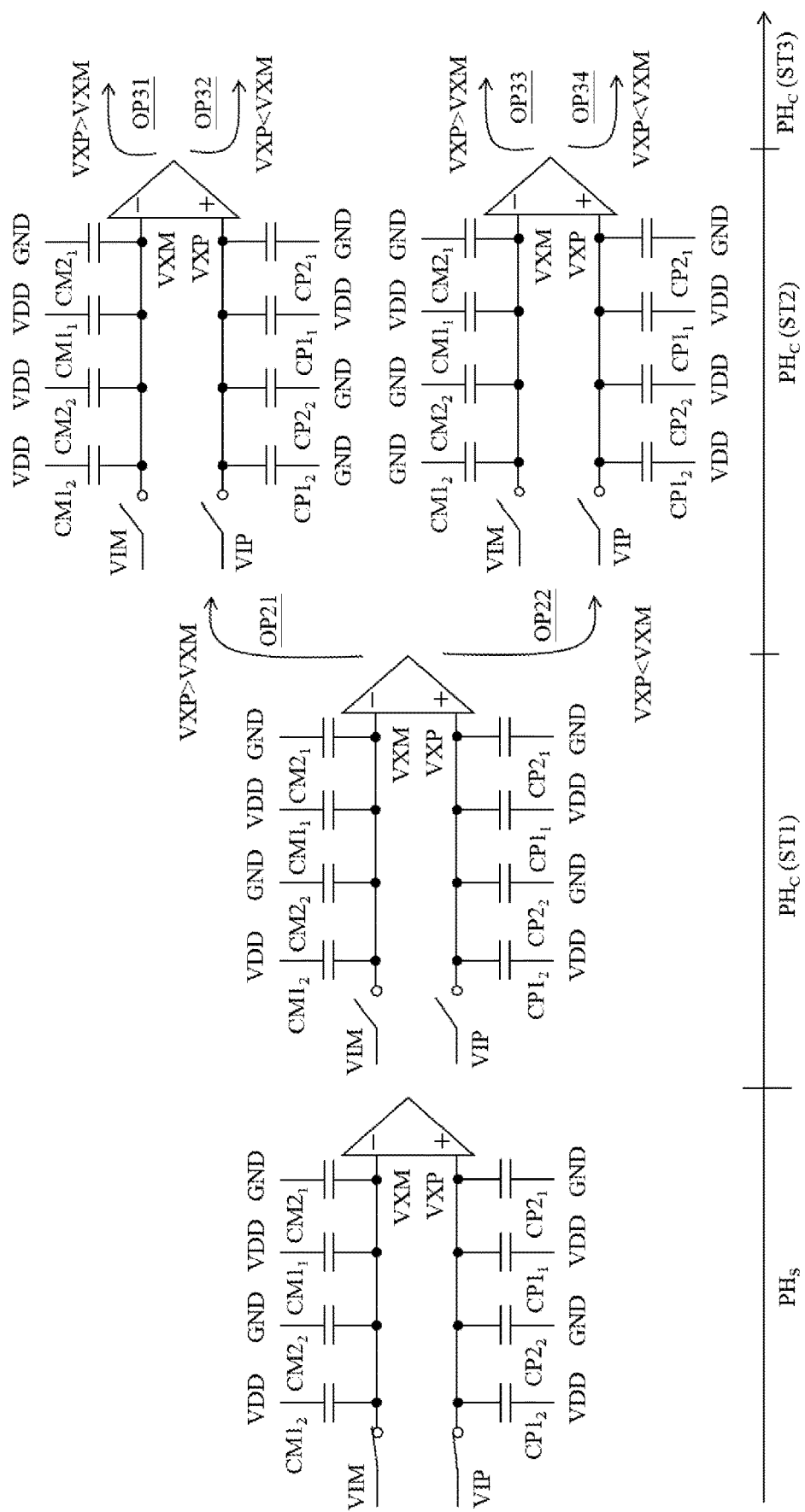
FIG. 9 illustrates exemplary operation of the DAC shown in FIG. 8 in accordance with some embodiments of the present disclosure.

FIG. 9 illustrate exemplary operation of the DAC 830 shown in FIG. 8 in accordance with some embodiments of the present disclosure. Referring to FIG. 9 and also to FIG. 8, during the sampling phase $PH_S$, one capacitor in each pair of capacitors of the switched capacitor array 232 is coupled between the voltage signal VIM and the power supply voltage VDD, and the other capacitor in the pair of capacitors is coupled between the voltage signal VIM and the ground voltage GND. In addition, one capacitor in each pair of capacitors of the switched capacitor array 234 is coupled between the voltage signal VIP and the power supply voltage VDD, and the other capacitor in the pair of capacitors is coupled between the voltage signal VIP and the ground voltage GND.

For example, during the sampling phase $PH_S$, each of the switches $SM1_1$ and $SM1_2$ is configured to couple the power supply voltage VDD to the terminal N11 of a corresponding capacitor. Each of the switches $SM2_1$ and $SM2_2$ is configured to couple the ground voltage GND to the terminal N11 of a corresponding capacitor. Each of the switches $SP1_1$ and $SP1_2$ is configured to couple the power supply voltage VDD to the terminal N21 of a corresponding capacitor. Each of the switches $SP2_1$ and $SP2_2$ is configured to couple the ground voltage GND to the terminal N21 of a corresponding capacitor. In addition, the switch $SMC_1$ is configured to couple the voltage signal VIM to the input terminal TM. The switch $SMC_2$ is configured to couple the voltage signal VIP to the input terminal TP.

During the conversion phase $PH_C$, two capacitors in a pair of capacitors can be coupled to the power supply voltage VDD and the ground voltage GND, respectively. For example, in the conversion step ST1, each of the switches $SMC_1$ and $SMC_2$ is switched off. As those skilled in the art can appreciate that the operation of the DAC 830 in the conversion steps ST1-ST3 is similar/identical to that shown in FIG. 3A and FIG. 3B after reading the above paragraphs directed to FIG. 1 to FIG. 8, further description is omitted here for brevity. Additionally, in some embodiments, the DAC 830 can be used to implement a SAR ADC, operating in a single-ended mode, based on the operation described with reference to FIG. 3C and FIG. 3D without departing from the scope of the present disclosure.

Figure 10:
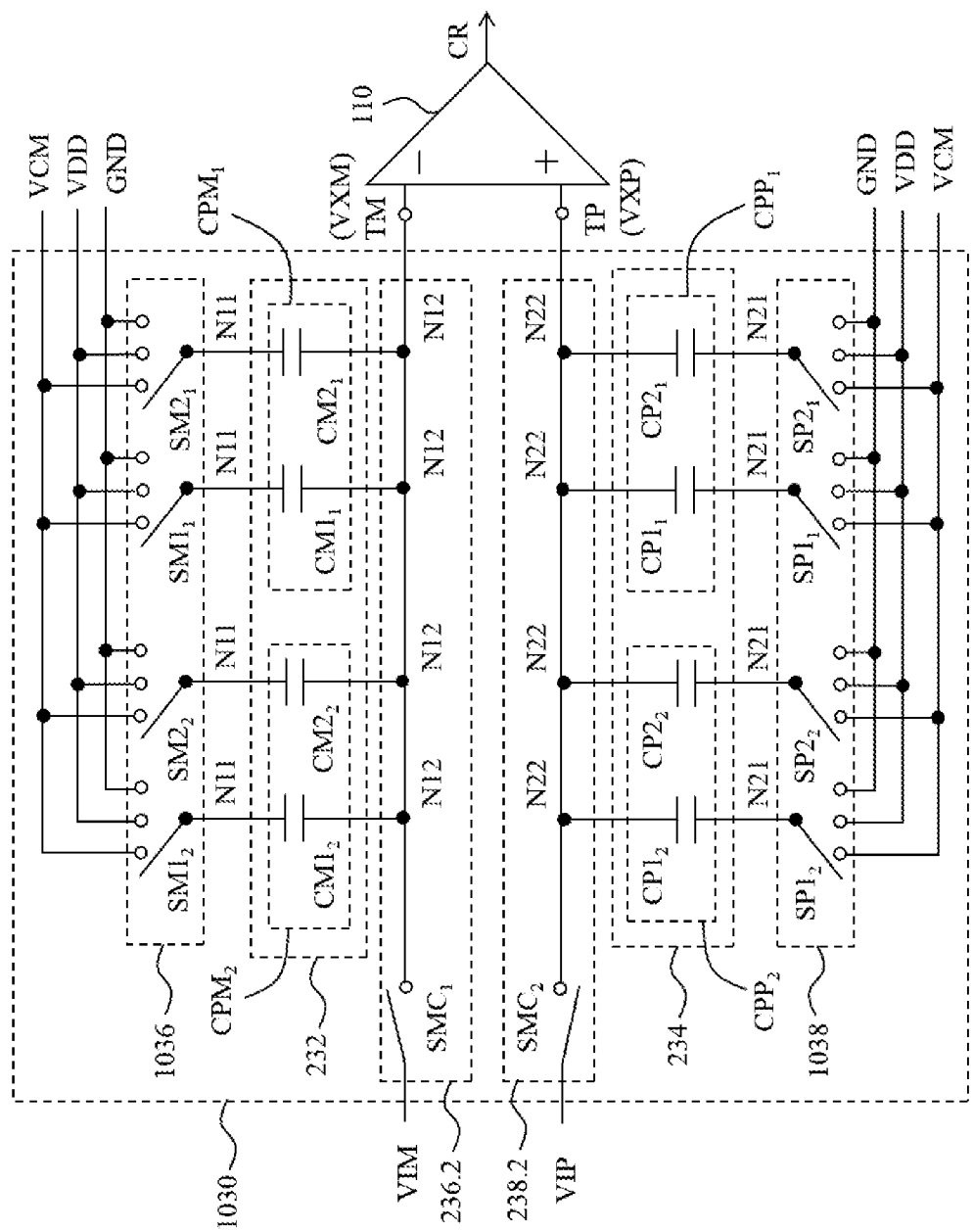
FIG. 10 illustrates another implementation of the DAC shown in FIG. 1 in accordance with some embodiments of the present disclosure.

FIG. 10 illustrates another implementation of the DAC 130 shown in FIG. 1 in accordance with some embodiments of the present disclosure. The structure of the DAC 1030 is similar/identical to the structure of the DAC 830 shown in FIG. 8 except that, for example, each capacitor of the DAC 1030 can be coupled to one of the common-mode voltage VCM, the power supply voltage VDD and the ground voltage GND.

In the present embodiment, the switch circuit 1036 is arranged to selectively couple the terminal N11 of each capacitor of the switched capacitor array 232 to one of the common-mode voltage VCM, the power supply voltage VDD and the ground voltage GND according to the digital signal SD1. The switch circuit 1036 may be implemented using the switches $SM1_1$, $SM2_1$, $SM1_2$, and $SM2_2$ shown in FIG. 2. The switch circuit 1038 is arranged to selectively couple the terminal N21 of each capacitor of the switched capacitor array 234 to one of the common-mode voltage VCM, the power supply voltage VDD and the ground voltage GND according to the digital signal SD2. The switch circuit 1038 may be implemented using the switches $SP1_1$, $SP2_1$, $SP1_2$, and $SP2_2$ shown in FIG. 2.

Figure 11:
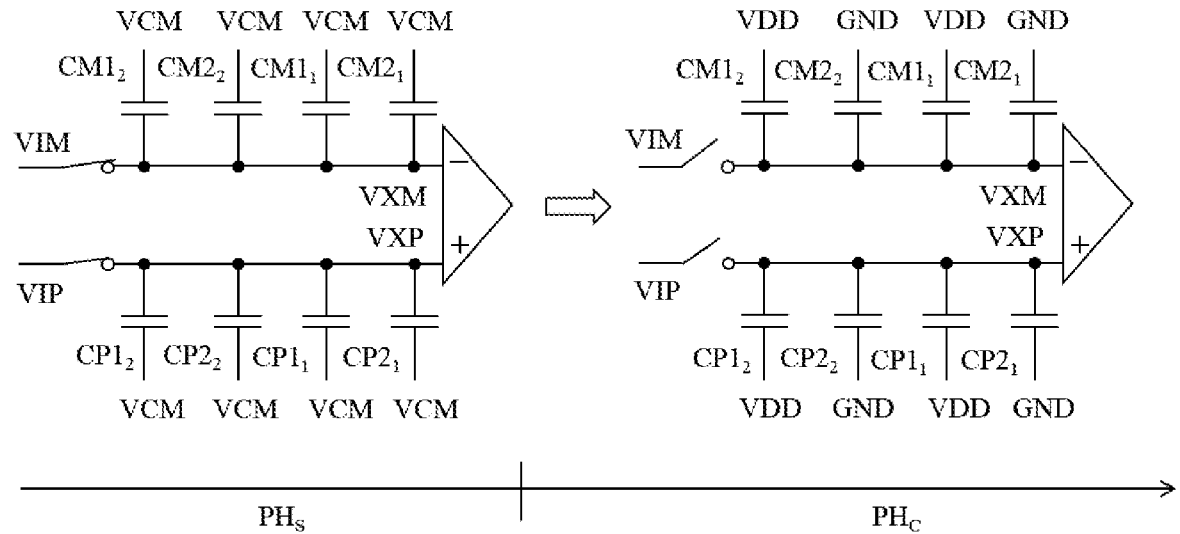
FIG. 11 illustrates exemplary operation of the DAC shown in FIG. 10 in accordance with some embodiments of the present disclosure.

FIG. 11 illustrates exemplary operation of the DAC 1030 shown in FIG. 10 in accordance with some embodiments of the present disclosure. Referring to FIG. 11 and also to FIG. 10, during the sampling phase $PH_S$, each of the switches $SMC_1$ and $SMC_2$ is switched on. Each capacitor of the switched capacitor array 232 can be coupled between the common-mode voltage VCM and the voltage signal VIM, and each capacitor of the switched capacitor array 234 can be coupled between the common-mode voltage VCM and the voltage signal VIP. At the beginning of the conversion phase $PH_C$, each of the switches $SMC_1$ and $SMC_2$ is switched off. Each of the capacitors $CM1_1$ and $CM1_2$ is coupled between the input terminal TM and the power supply voltage VDD, and each of the capacitors $CM2_1$ and $CM2_2$ is coupled between the input terminal TM and the ground voltage GND. Each of the capacitors $CP1_1$ and $CP1_2$ is coupled between the input terminal TP and the power supply voltage VDD, and each of the capacitors $CP2_1$ and $CP2_2$ is coupled between the input terminal TP and the ground voltage GND. As those skilled in the art can appreciate that the operation of the DAC 1030 during the conversion phase $PH_C$ shown in FIG. 11 is similar/identical to that shown in FIG. 3A and FIG. 3B after reading the above paragraphs directed to FIG. 1 to FIG. 10, further description is omitted here for brevity. Additionally, in some embodiments, the DAC 1030 can be used to implement a SAR ADC, operating in a single-ended mode, based on the operation described with reference to FIG. 3C and FIG. 3D without departing from the scope of the present disclosure.

Figure 12:
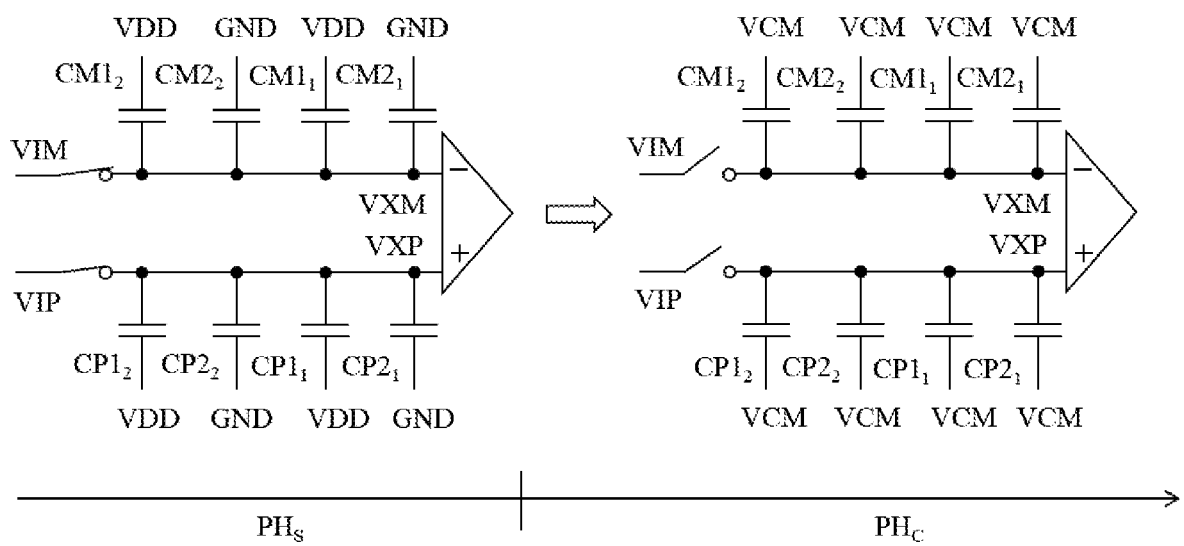
FIG. 12 illustrates exemplary operation of the DAC shown in FIG. 10 in accordance with some embodiments of the present disclosure.

FIG. 12 illustrates exemplary operation of the DAC 1030 shown in FIG. 10 in accordance with some embodiments of the present disclosure. Referring to FIG. 12 and also to FIG. 10, during the sampling phase $PH_S$, each of the switches $SMC_1$ and $SMC_2$ is switched on. Each of the capacitors $CM1_1$ and $CM1_2$ is coupled between the voltage signal VIM and the power supply voltage VDD, and each of the capacitors $CM2_1$ and $CM2_2$ is coupled between the voltage signal VIM and the ground voltage GND. Each of the capacitors $CP1_1$ and $CP1_2$ is coupled between the voltage signal VIP and the power supply voltage VDD, and each of the capacitors $CP2_1$ and $CP2_2$ is coupled between the voltage signal VIP and the ground voltage GND. At the beginning of the conversion phase $PH_C$, each of the switches $SMC_1$ and $SMC_2$ is switched off. Each capacitor of the switched capacitor array 232 can be coupled between the common-mode voltage VCM and the input terminal TM, and each capacitor of the switched capacitor array 234 can be coupled between the common-mode voltage VCM and the input terminal TP. As those skilled in the art can appreciate that the operation of the DAC 1030 during the conversion phase $PH_C$ shown in FIG. 12 is similar/identical to that shown in FIG. 3A and FIG. 3B after reading the above paragraphs directed to FIG. 1 to FIG. 10, further description is omitted here for brevity.

Figure 13:
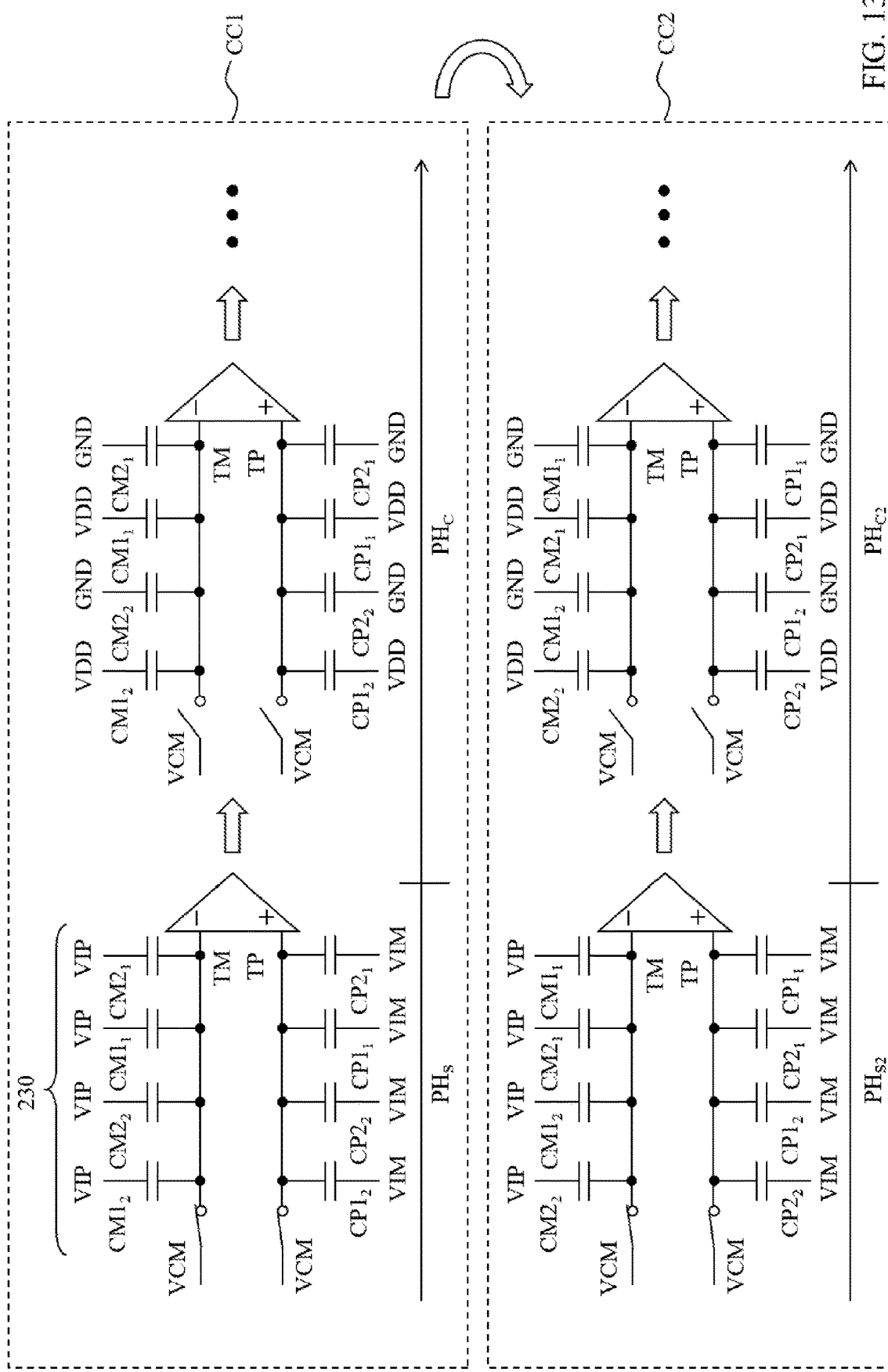
FIG. 13 illustrates exemplary operation of the DAC shown in FIG. 2 in different conversion cycles in accordance with some embodiments of the present disclosure.

In some embodiments, reference signals respectively coupled to two capacitors, included in a same pair of capacitors, can be exchanged in response to different conversion cycles to thereby reduce the effect of capacitor mismatch. FIG. 13 illustrates exemplary operation of the DAC 230 shown in FIG. 2 in different conversion cycles in accordance with some embodiments of the present disclosure. In the present embodiment, the DAC 230 operates in different conversion cycles CC1 and CC2, wherein the conversion cycle CC1 includes the sampling phase $PH_S$ and the conversion phase $PH_C$ shown in FIG. 3A and FIG. 3B.

Referring to FIG. 13 and also to FIG. 1, the DAC 230 is used to implement the DAC 130 shown in FIG. 1, wherein the signal conversion circuit 100 can be configured to convert the input signal AIN in the conversion cycle CC1 to generate a conversion result, such as the output signal DOUT outputted at the end of the conversion cycle CC1. Also, the signal conversion circuit 100 can be configured to convert the input signal AIN in the conversion cycle CC2 to generate another conversion result, such as the output signal DOUT outputted at the end of the conversion cycle CC2.

The conversion cycle CC2 includes a sampling phase $PH_{S2}$ and a conversion phase $PH_{C2}$.

The operation performed during the sampling phase $PH_{S2}$ and the conversion phase $PH_{C2}$ is similar/identical to that performed during the sampling phase $PH_S$ and the conversion phase $PH_C$ except for reference signals applied to a same pair of capacitors. For example, in the embodiment shown in FIG. 13, during the conversion phase $PH_C$ in the conversion cycle CC1, each of the capacitors $CM1_1$ and $CM1_2$ is coupled between the input terminal TM and the power supply voltage VDD, and each of the capacitors $CM2_1$ and $CM2_2$ is coupled between the input terminal TM and the ground voltage GND. During the conversion phase $PH_{C2}$ in the conversion cycle CC2, each of the capacitors $CM1_1$ and $CM1_2$ is coupled between the input terminal TM and the ground voltage GND, and each of the capacitors $CM2_1$ and $CM2_2$ is coupled between the input terminal TM and the power supply voltage VDD. Similarly, during the conversion phase $PH_C$ in the conversion cycle CC1, each of the capacitors $CP1_1$ and $CP1_2$ is coupled between the input terminal TP and the power supply voltage VDD, and each of the capacitors $CP2_1$ and $CP2_2$ is coupled between the input terminal TP and the ground voltage GND. During the conversion phase $PH_{C2}$ in the conversion cycle CC2, each of the capacitors $CP1_1$ and $CP1_2$ is coupled between the input terminal TP and the ground voltage GND, and each of the capacitors $CP2_1$ and $CP2_2$ is coupled between the input terminal TP and the power supply voltage VDD. In other words, reference signals respectively coupled to two capacitors, included in a same pair of capacitors, can be exchanged or swapped when the DAC 230 operates in a different conversion cycle.

In some embodiments, the proposed signal conversion scheme may exchange reference signals applied to two capacitors in a same pair of capacitors once every predetermined number of conversion cycles. It is worth noting that the signal exchange scheme shown in FIG. 13 can be employed in the DAC 130 shown in FIG. 1, the DAC 230 shown in FIG. 2, the DAC 430 shown in FIG. 4, the DAC 630 shown in FIG. 6, the DAC 830 shown in FIG. 8, the DAC 1030 shown in FIG. 10, and other circuit implementations of the DAC 130 shown in FIG. 1 to reduce the effect of capacitor mismatch.

With the use of the proposed signal conversion scheme, power consumption caused by a power-hungry register for storing a common-mode voltage can be greatly reduced. Additionally, the proposed signal conversion scheme can reduce the effect of capacitor mismatch by exchanging reference signals applied to two capacitors included in a same pair of capacitors in response to different conversion cycles.

As used herein, the terms "substantially" are used to describe and account for small variations. When used in conduction with an event or circumstance, the terms can refer to instances in which the event of circumstance occurs precisely as well as instances in which the event or circumstance occurs to a close approximation. As used herein with respect to ta given value or range, the term "substantially" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. In addition, when referring to numerical values or characteristics as "substantially" the same, the term can refer to the values lying within ±10%, ±5%, ±1%, or ±0.5% of an average of the values.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal conversion circuit, comprising:
   a first pair of capacitors, comprising a first capacitor and a second capacitor having a same capacitance value, each of the first capacitor and the second capacitor being coupled to an input signal during a first sampling phase, while uncoupled from the input signal during a first conversion phase after the first sampling phase; and
   a comparator, having a first input terminal and a second input terminal, wherein during the first conversion phase, the first capacitor is coupled between the first input terminal and a first reference signal, the second capacitor is coupled between the first input terminal and a second reference signal different from the first reference signal, and the comparator is configured to compare a signal level at the first input terminal and a signal level at the second input terminal to convert the input signal;
   wherein during the first sampling phase, respective first terminals of the first capacitor and the second capacitor are coupled to the input signal, and respective second terminals of the first capacitor and the second capacitor are coupled to the first reference signal and the second reference signal, respectively; during the first conversion phase, the respective first terminals of the first capacitor and the second capacitor are coupled to the first reference signal and the second reference signal, respectively, and the respective second terminals of the first capacitor and the second capacitor are coupled to the first input terminal.

2. The signal conversion circuit of claim 1, wherein when a comparison result outputted from an output terminal of the comparator indicates that the signal level at the first input terminal is less than the signal level at the second input terminal, the second capacitor is arranged to be coupled between the first input terminal and the first reference signal; when the comparison result indicates that the signal level at the first input terminal is greater than the signal level at the second input terminal, the first capacitor is arranged to be coupled between the first input terminal and the second reference signal.

3. A signal conversion circuit, comprising:
   a first pair of capacitors, comprising a first capacitor and a second capacitor having a same capacitance value, each of the first capacitor and the second capacitor being coupled to an input signal during a first sampling phase, while uncoupled from the input signal during a first conversion phase after the first sampling phase; and
   a comparator, having a first input terminal and a second input terminal, wherein during the first conversion phase, the first capacitor is coupled between the first input terminal and a first reference signal, the second capacitor is coupled between the first input terminal and a second reference signal different from the first reference signal, and the comparator is configured to compare a signal level at the first input terminal and a signal level at the second input terminal to convert the input signal;

during the first sampling phase, respective first terminals of the first capacitor and the second capacitor are coupled to a third reference signal, and respective second terminals of the first capacitor and the second capacitor are coupled to the input signal; the third reference signal is different from each of the first reference signal and the second reference signal; during the first conversion phase, the respective first terminals of the first capacitor and the second capacitor are coupled to the first reference signal and the second reference signal, respectively, and the respective second terminals of the first capacitor and the second capacitor are coupled to the first input terminal.

4. The signal conversion circuit of claim 3, wherein a signal level of the third reference signal is equal to an average of a signal level of the first reference signal and a signal level of the second reference signal.

5. The signal conversion circuit of claim 1, wherein the input signal is a differential signal comprising a positive component and a negative component, and each of the first capacitor and the second capacitor is coupled to one of the positive component and the negative component during the first sampling phase; the signal conversion circuit further comprises:

a second pair of capacitors, comprising a third capacitor and a fourth capacitor having a same capacitance value, each of the third capacitor and the fourth capacitor being coupled to the other of the positive component and the negative component during the first sampling phase, while uncoupled from the input signal during the first conversion phase, wherein during the first conversion phase, the third capacitor is coupled between the second input terminal and the first reference signal, and the fourth capacitor is coupled between the second input terminal and the second reference signal.

6. The signal conversion circuit of claim 1, further comprising:

a pair of second capacitors, comprising a third capacitor and a fourth capacitor, wherein each of the third capacitor and the fourth capacitor has a capacitance value equal to one half of the capacitance value of the first capacitor, and is coupled to the input signal during the first sampling phase; during the first conversion phase, the third capacitor is coupled between the first input terminal and the first reference signal, and the fourth capacitor is coupled between the first input terminal and the second reference signal.

7. The signal conversion circuit of claim 1, being configured to convert the input signal in a first conversion cycle to generate a first conversion result, and convert the input signal in a second conversion cycle to generate a second conversion result, wherein the first conversion cycle comprises the first sampling phase and the first conversion phase, and the second conversion cycle comprises a second sampling phase and a second conversion phase; each of the first capacitor and the second capacitor is coupled to the input signal during the second sampling phase, while uncoupled from the input signal during the second conversion phase; during the second conversion phase, the first capacitor is coupled between the first input terminal and the second reference signal, and the second capacitor is coupled between the first input terminal and the first reference signal.

8. A signal conversion circuit, comprising:

a first pair of capacitors, comprising a first capacitor and a second capacitor having a same capacitance value, wherein during a first sampling phase, the first capacitor is coupled between an input signal and a first reference signal, and the second capacitor is coupled between the input signal and a second reference signal different from the first reference signal; and a comparator, having a first input terminal and a second input terminal, wherein during a first conversion phase after the first sampling phase, each of the first capacitor and the second capacitor is coupled to the first input terminal while uncoupled from the input signal, and the comparator is configured to compare a signal level at the first input terminal and a signal level at the second input terminal to convert the input signal;

wherein each of the first capacitor and the second capacitor is coupled between a third reference signal and the first input terminal during the first conversion phase, and the third reference signal is different from each of the first reference signal and the second reference signal.

9. The signal conversion circuit of claim 8, wherein when a comparison result outputted from an output terminal of the comparator indicates that the signal level at the first input terminal is less than the signal level at the second input terminal, each of the first capacitor and the second capacitor is arranged to be coupled between the first input terminal and the first reference signal; when the comparison result indicates that the signal level at the first input terminal is greater than the signal level at the second input terminal, each of the first capacitor and the second capacitor is arranged to be coupled between the first input terminal and the second reference signal.

10. The signal conversion circuit of claim 8, wherein during the first sampling phase, the respective first terminals of the first capacitor and the second capacitor are coupled to the input signal, and respective second terminals of the first capacitor and the second capacitor are coupled to the first reference signal and the second reference signal, respectively; during the first conversion phase, respective first terminals of the first capacitor and the second capacitor are coupled to the third reference signal, and respective second terminals of the first capacitor and the second capacitor are coupled to the first input terminal.

11. The signal conversion circuit of claim 8, wherein during the first sampling phase, respective first terminals of the first capacitor and the second capacitor are coupled to the first reference signal and the second reference signal, respectively, and respective second terminals of the first capacitor and the second capacitor are coupled to the input signal; during the first conversion phase, the respective first terminals of the first capacitor and the second capacitor are coupled to the third reference signal, and the respective second terminals of the first capacitor and the second capacitor are coupled to the first input terminal.

12. The signal conversion circuit of claim 8, wherein the input signal is a differential signal comprising a positive component and a negative component, and each of the first capacitor and the second capacitor is coupled to one of the positive component and the negative component during the first sampling phase; the signal conversion circuit further comprises:

a second pair of capacitors, comprising a third capacitor and a fourth capacitor having a same capacitance value, each of the third capacitor and the fourth capacitor being coupled to the other of the positive component and the negative component during the first sampling phase, while uncoupled from the input signal during the first conversion phase, wherein during the first conversion phase, the third capacitor is coupled between the second input terminal and the first reference signal, and the fourth capacitor is coupled between the second input terminal and the second reference signal.

13. The signal conversion circuit of claim 8, further comprising:
a pair of second capacitors, comprising a third capacitor and a fourth capacitor, wherein each of the third capacitor and the fourth capacitor has a capacitance value equal to one half of the capacitance value of the first capacitor, and is coupled to the input signal during the first sampling phase; during the first conversion phase, the third capacitor is coupled between the first input terminal and the first reference signal, and the fourth capacitor is coupled between the first input terminal and the second reference signal.

14. The signal conversion circuit of claim 8, being configured to convert the input signal in a first conversion cycle to generate a first conversion result, and convert the input signal in a second conversion cycle to generate a second conversion result, wherein the first conversion cycle comprises the first sampling phase and the first conversion phase, and the second conversion cycle comprises a second sampling phase and a second conversion phase; each of the first capacitor and the second capacitor is coupled to the input signal during the second sampling phase, while uncoupled from the input signal during the second conversion phase;
during the second conversion phase, the first capacitor is coupled between the first input terminal and the second reference signal, and the second capacitor is coupled between the first input terminal and the first reference signal.

15. A signal conversion circuit, comprising:
a first pair of capacitors, comprising a first capacitor and a second capacitor having a same capacitance value, each of the first capacitor and the second capacitor being coupled to an input signal during a first sampling phase, while uncoupled from the input signal during a first conversion phase after the first sampling phase; and
a comparator, having a first input terminal and a second input terminal, wherein during the first conversion phase, the first capacitor is coupled between the first input terminal and a first reference signal, the second capacitor is coupled between the first input terminal and a second reference signal different from the first reference signal, and the comparator is configured to compare a signal level at the first input terminal and a signal level at the second input terminal to convert the input signal;
wherein the signal conversion circuit is configured to convert the input signal in a first conversion cycle to generate a first conversion result, and convert the input signal in a second conversion cycle to generate a second conversion result; the first conversion cycle comprises the first sampling phase and the first conversion phase, and the second conversion cycle comprises a second sampling phase and a second conversion phase;
wherein each of the first capacitor and the second capacitor is coupled to the input signal during the second sampling phase, while uncoupled from the input signal during the second conversion phase; during the second conversion phase, the first capacitor is coupled between the first input terminal and the second reference signal, and the second capacitor is coupled between the first input terminal and the first reference signal.

16. A signal conversion circuit, comprising:
a first pair of capacitors, comprising a first capacitor and a second capacitor having a same capacitance value, wherein during a first sampling phase, the first capacitor is coupled between an input signal and a first reference signal, and the second capacitor is coupled between the input signal and a second reference signal different from the first reference signal; and
a comparator, having a first input terminal and a second input terminal, wherein during a first conversion phase after the first sampling phase, each of the first capacitor and the second capacitor is coupled to the first input terminal while uncoupled from the input signal, and the comparator is configured to compare a signal level at the first input terminal and a signal level at the second input terminal to convert the input signal;
wherein the signal conversion circuit is configured to convert the input signal in a first conversion cycle to generate a first conversion result, and convert the input signal in a second conversion cycle to generate a second conversion result; the first conversion cycle comprises the first sampling phase and the first conversion phase, and the second conversion cycle comprises a second sampling phase and a second conversion phase;
wherein each of the first capacitor and the second capacitor is coupled to the input signal during the second sampling phase, while uncoupled from the input signal during the second conversion phase; during the second conversion phase, the first capacitor is coupled between the first input terminal and the second reference signal, and the second capacitor is coupled between the first input terminal and the first reference signal.

* * * * *